US008304642B1

(12) United States Patent
Bryan

(10) Patent No.: US 8,304,642 B1
(45) Date of Patent: Nov. 6, 2012

(54) MUSIC AND LYRICS DISPLAY METHOD

(76) Inventor: Robison James Bryan, North Hills, CA (US)

( * ) Notice: Subject to any disclaimer, the term of this patent is extended or adjusted under 35 U.S.C. 154(b) by 638 days.

(21) Appl. No.: 12/215,805

(22) Filed: Jun. 30, 2008

Related U.S. Application Data

(63) Continuation-in-part of application No. 11/714,893, filed on Mar. 6, 2007, now abandoned.

(60) Provisional application No. 60/780,508, filed on Mar. 9, 2006.

(51) Int. Cl.
*G10H 1/00* (2006.01)
*G10H 7/00* (2006.01)
*G11C 1/00* (2006.01)

(52) U.S. Cl. ........................................ 84/601; 84/477 R

(58) Field of Classification Search ................ 84/477 R, 84/478, 600, 601
See application file for complete search history.

(56) References Cited

U.S. PATENT DOCUMENTS 6,015,947 A * 1/2000 Moberg ...................... 84/471 R
6,582,235 B1 * 6/2003 Tsai et al. ................. 434/307 A
6,727,418 B2 * 4/2004 Matsumoto ................. 84/477 R
6,838,608 B2 * 1/2005 Koike ......................... 84/477 R
7,030,307 B2 * 4/2006 Wedel ......................... 84/477 R
7,199,299 B2 * 4/2007 Asakura ...................... 84/477 R
7,579,543 B2 * 8/2009 Haruyama et al. .............. 84/601
7,601,906 B2 * 10/2009 Craig et al. ...................... 84/611
7,763,790 B2 * 7/2010 Robledo ...................... 84/483.2
2003/0195851 A1 * 10/2003 Ong ................................ 705/50
2005/0109195 A1 * 5/2005 Haruyama et al. .............. 84/645

* cited by examiner

*Primary Examiner* — Jeffrey Donels

(57) ABSTRACT

The MUSIC AND LYRICS DISPLAY METHOD provides for a complete solution comprising a way of displaying correct portions of lyrics and or musical notation at appropriate times while something live is happening. By using a predetermined series of symbols in a song sequence, symbols may serve as indices for looking up and displaying distinct portions of lyrics identified by corresponding symbols comprised within bodies of lyrics. Furthermore, when displaying words and music notation, notes are spaced horizontally to align with words that are large and not broken up, such that words are natural looking and easy to read, while musical notes are easy to sight read with words to which they obviously correspond. Another aspect of the present invention allows for providing such multimedia in such a way that users may play audio for free for a certain span of days or demo trial period, and where users may register to retain access thereto.

10 Claims, 21 Drawing Sheets

| | |
|---|---|
| p=a/(3+(abs(a-g))) | r=b/(3+(abs(b-h))) |
| s=c/(3+(abs(c-j))) | t=d/(3+(abs(d-k))) |
| u=e/(3+(abs(e-m))) | v=f/(3+(abs(f-n))) |

w=p+r+s+t+u+v

100 → V1. This is the first line of the first verse.
This is the second line of the first verse.
This is the third line of the first verse. } 110
This is the fourth line of the first verse.

120 → V2. This is the first line of the second verse.
This is the second line of the second verse.
This is the third line of the second verse. } 130
This is the fourth line of the second verse.

140 → V3. This is the first line of the third verse.
This is the second line of the third verse.
This is the third line of the third verse. } 150
This is the fourth line of the third verse.

160 → V4. This is the first line of the fourth verse.
This is the second line of the fourth verse.
This is the third line of the fourth verse. } 170
This is the fourth line of the fourth verse.

180 → C. This is the first line of the chorus.
This is the second line of the chorus.
This is the third line of the first chorus. } 190
This is the fourth line of the first chorus.

Figure 1

| | |
|---|---|
| p=a/(3+(abs(a-g))) | r=b/(3+(abs(b-h))) |
| s=c/(3+(abs(c-j))) | t=d/(3+(abs(d-k))) |
| u=e/(3+(abs(e-m))) | v=f/(3+(abs(f-n))) |

w=p+r+s+t+u+v w is the weighted similarity score for the comparison of these two lines. w may be compared to x, which would be the comparison of one of these two lines with a different line.

MUSIC AND LYRICS DISPLAY METHOD

CONTINUATION-IN-PART (CIP) UTILITY PATENT APPLICATION

This Patent application is a Continuation-in-Part (CIP) of Prior application Ser. No. 11/714,893, whose Examiner name is Jeffrey Donels and whose Art Unit is 2837. This Continuation in Part Patent application claims benefit of utility patent application entitled "METHOD FOR PERFORMING PREDETERMINED AND OR IMPROVISED SEQUENCES OF PORTIONS OF LYRICAL AND OR MUSICAL DISPLAY", USPTO Ser. No. 11/714,893, filed on Mar. 6, 2007 now abandoned with Robison Bryan as inventor. Said non-provisional patent is to be known herein as "The Parent Patent", the full text of which is to be considered as incorporated herein by reference (but the only claims being claimed herein are the claims directly included herein). By virtue of its being a Continuation in Part of the Parent Patent Application, this Non-Provisional Patent application also claims benefit of provisional patent application entitled "METHOD FOR PERFORMING PREDETERMINED AND OR IMPROVISED SEQUENCES OF PORTIONS OF LYRICAL AND OR MUSICAL DISPLAY", USPTO Ser. No. 60/780,508, filed on Mar. 9, 2006 with Robison Bryan as inventor. Said provisional patent is to be known herein as "The Provisional Patent", the full text of which is to be considered as incorporated herein by reference.

It should be understood that examples given herein are illustrative and useful for teaching, but no liability shall be held for usefulness or effectiveness of any code disclosed herein. Furthermore no formatting, typographical or other minor coding errors, omissions or changes should be misconstrued as to deter from the efficacy of this teaching, provided that the intent is sufficiently clear to enable one fully skilled in the relevant arts to demonstrate the claimed invention. Here below continues the material from the parent patent.

NOTICE OF MATERIAL SUBJECT TO COPYRIGHT PROTECTION

All of the material in this patent document is subject to copyright protection under the copyright laws of the United States and of other countries. The owner of the copyright has no objection to the facsimile reproduction by anyone of the patent document or the patent disclosure, as it appears in the United States Patent and Trademark Office file or records, but otherwise reserves all copyrights whatsoever.

INTRODUCTION

As an interdisciplinary invention, the present invention combines methodologies and principles known to those who practice within a variety of areas of the present state of the art. Whereas this teaching of the present invention does not try to educate practitioners of one subset of the state of the art regarding matters well known to practitioners of another subset of the state of the art, it is nonetheless such that it ought to be readily understood by anyone simultaneously skilled in all relevant areas of the present state of the art including music theory, traditional music notation, popular music song structure and notation, worship overhead slide preparation and usage, digital and analog electronic design, audio engineering including audio processing, sound reinforcement and mixing, computer programming and graphic subsystem APIs. Anyone seeking sufficient understanding to implement the present invention need look no further than publicly available tutorials and educational materials within each of the relevant areas of the state of the art, and of course, by necessity, this teaching.

FIELD OF THE INVENTION

The present invention relates primarily to the timely display of musical information coincident with a live aspect of performance or its functional equivalent.

BACKGROUND OF THE INVENTION

The usage of overhead projection software is well established for liturgical and secular applications. In both liturgical usage and secular usage certain problems exist, some solutions of which I will discuss in regard to liturgical uses, whereas it should be understood that the same principles also apply just as well to secular uses.

There have been in the usage of overhead software problems relating to the timely display of portions of a lyric (and the same problems would apply to musical notation). Such problems relate to the fact that the person(s) running some overhead software often does not know what portion to display until the performance of said portion has already begun. This results in the congregation either mumbling, singing the wrong words or not at all during the first line of each new verse, since the projection comes late with the words. Even after the projectionist knows what portion is being sung, he or she must then locate and load the correct slide for such portion, which in itself takes additional time.

SUMMARY OF THE INVENTION

The MUSIC AND LYRICS DISPLAY METHOD provides ways of displaying correct portions of lyrics and or musical notation at appropriate times. In typical usage of the present invention there is an interaction between a live aspect of performance and some preexisting musical and or lyrical information. Because of this primary focus, although an embodiment of the present invention could be used to facilitate automated display coincident with prerecorded (and or automated) music, the present invention normally deals with live projection coincident with prerecorded (and or automated) music, automated projection coincident with live music and or live projection coincident with live music. Whereas other aspects of such problems and details of more comprehensive solutions are also described and or indicated herein, a most basic solution shall immediately be described, which is also foundational to some more comprehensive solutions later discussed. Such most basic solution is implemented by three essential events taking place:

1. A sequence of musical portions is predetermined.
2. A projectionist functionality acquires such predetermined sequence.
3. A human interface functionality of such projectionist functionality advances each sequence step, causing a technology embodying the present invention to look up the next portion in the sequence and prepare its display.

These three basic events make it possible for the projectionist to cause the display of musical portions sufficiently prior to their exact time of live performance. There are other important aspects of the present invention beyond those presented above, which will be described below. Certain aspects below will be found to be enabling toward accomplishing not only those primary aspects above, but also toward more fully understanding the intent, some implementations and some variations of the present invention. Certain of such aspects will be found to enhance the usefulness of the present invention as well.

BRIEF DESCRIPTION OF THE DRAWINGS

FIG. 1 is a planar view of a hypothetical song lyric file according to a preferred embodiment of the present invention, wherein are shown symbols identifying individual portions of a hypothetical song.

DETAILED DESCRIPTION OF THE DRAWINGS

FIG. 1 shows a hypothetical song lyric file. I have indicated symbols that identify individual portions of the song. Verse 1 (110) is identified by the symbol "v1" (100); verse 2 (130) is identified by the symbol "v2" (120); the chorus (190) is identified by the symbol "c" (180) and so on.

Figure 2:
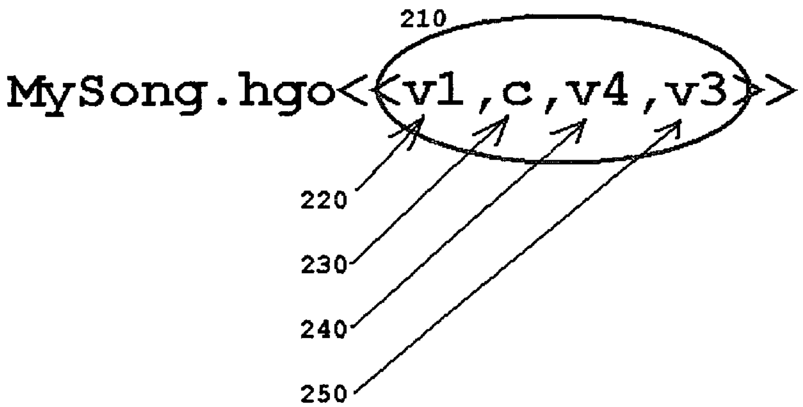
FIG. 2 is a planar view of a single line of a hypothetical song list file according to a preferred embodiment of the present invention implementing a format for sequence of performance, wherein is shown encircled therein an order of portions of such song.

FIG. 2 shows a single line of a hypothetical song list file, which implements a format for the sequence of performance. I have circled the order of portions (210) of this song. The order of portions (210) of this song is called the sequence. Notice how the first verse ("v1") (220) is specified, then the chorus ("c") (230), then the fourth verse ("v4") (240), then the third verse ("v3") (250). The order of specified portions will be understood as the order in which the portions should be displayed, because we plan to sing them in that order during live performance.

Figure 3:
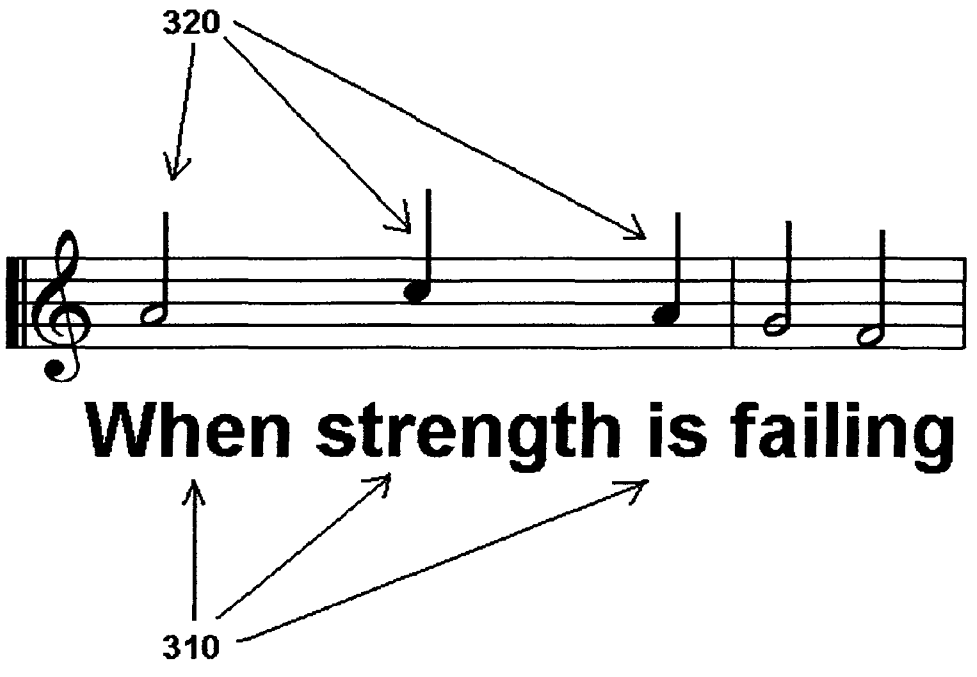
FIG. 3 is a planar view of a file according to a preferred embodiment of the present invention comprising a first line from a first verse of a hypothetical hymn showing large and unbroken words whose exact horizontal placement of syllables determines an exact horizontal placement of visible note symbols therein.

FIG. 3 shows the first line from a first verse of a hypothetical hymn. Notice how the words are really big and unbroken, and also notice how the exact horizontal placement of the syllables of the big words (310) determines the exact horizontal placement of the note symbols (320) in the sheet music aspect of that line. This is a departure from the normal way things are done in conventional sheet music notation. The words have traditionally been printed smaller, with dashes and spaces between syllables, in order to force the spacing of the words to conform to the spacing of the note symbols. But in this case the spacing of the note symbols is being forced to conform to the spacing of the word syllables, thus allowing the words to be printed much larger on the screen.

Figure 4:
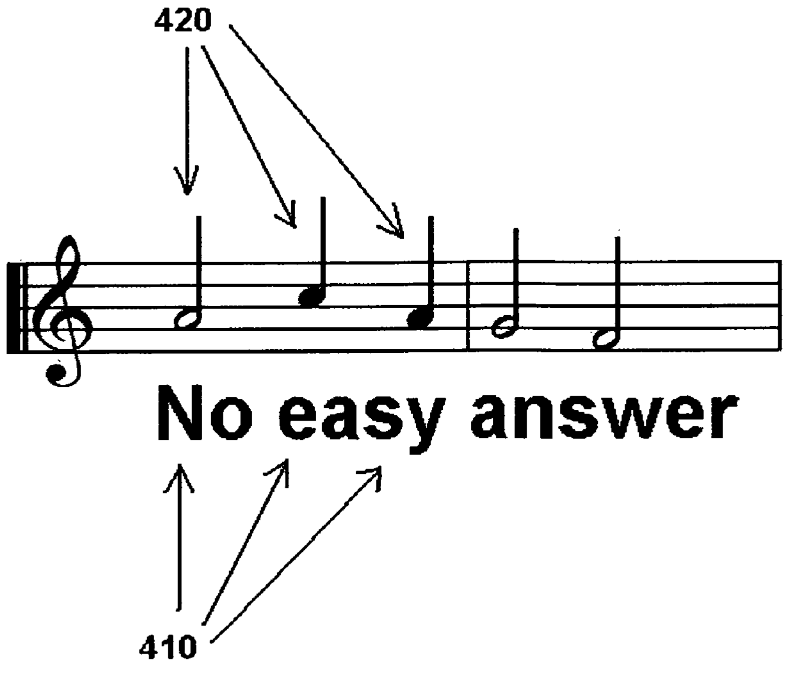
FIG. 4 is a planar view of a file according to a preferred embodiment of the present invention comprising a second line from a second verse of said hypothetical hymn showing large and unbroken words whose exact horizontal placement of syllables determines an exact horizontal placement of visible note symbols therein.

FIG. 4 shows the first line from a second verse of the same hypothetical hymn. Notice how the exact horizontal placement of the syllables of the words (410) determines the exact horizontal placement of the note symbols (420). Consequently you can see that the note symbol spacing seen in FIG. 4 is slightly different from that seen in FIG. 3.

Figure 5:
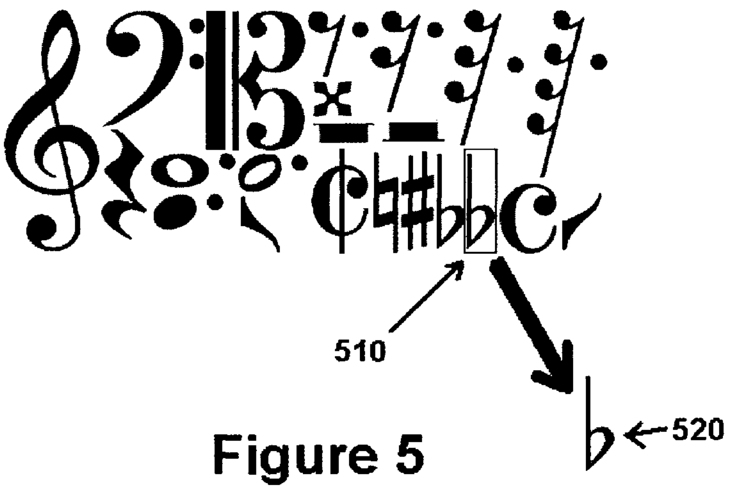
FIG. 5 is a planar view of a bitmap template of many musical notation shapes according to a preferred embodiment of the present invention for facilitating a software program to accomplish note spacing by copying rectangular portions thereof, each such rectangular portion thereof comprising one such musical notation symbol.

FIG. 5 is a bitmap template of many musical notation shapes. A software program that accomplishes the note spacing mentioned above can copy rectangular portions, where each rectangular portion (510) contains only one such musical notation symbol. The spacing and arrangement of the musical notation symbols in this template are such that when a correctly sized and placed rectangle is copied from the template, a complete musical notation symbol (520) is copied and no portion of any adjacent symbol is copied. This provides for a flexible and allignable display of sheet music symbols upon a virtual screen such that complete lines of sheet music (as seen in FIGS. 3 and 4) may be assembled.

Figure 6:
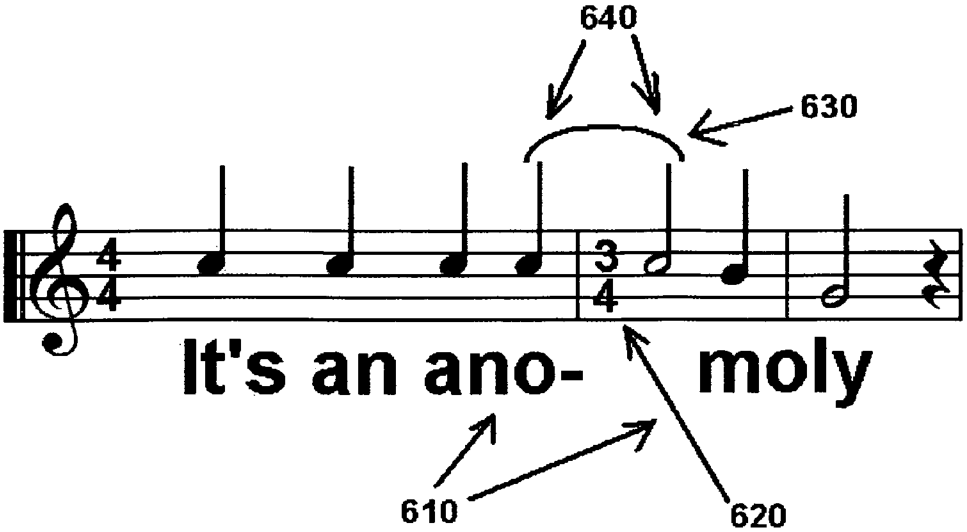
FIG. 6 is a planar view of a file according to a preferred embodiment of the present invention showing an exceptional case wherein two syllables of a word are separated to accommodate extra horizontal space occupied by musical notation symbols as necessitated by a word spanning a measure boundary with a new time signature.

FIG. 6 shows the exception to the rule about not breaking up the syllables of words. In this case you can see that two syllables (610) of the word had to be broken up to accommodate the extra horizontal space taken up by the extra musical notation symbols (640) necessitated by the fact that the word occurs across a measure boundary wherein a new time signature (620) is placed. If it weren't for that new time signature taking up even more space, perhaps it might have been possible to avoid breaking up the word.

Figure 7:
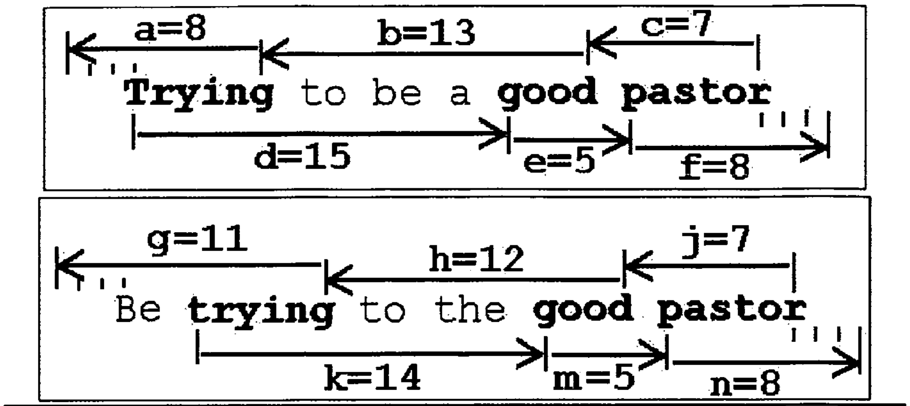
FIG. 7 illustrates a simple example of line comparison according to a particular embodiment of the present invention, wherein two lines considered to already have a same number of keywords in a same order, are yet not quite identical.

FIG. 7 shows a simple example of line comparison according to a particular embodiment of the present invention. Notice how the two lines considered already have the same number of keywords in the same order, yet the two lines are not quite identical. FIG. 7 shows a way of numerically assessing just how similar the two lines are to each other. Notice that every keyword has an adjacent keyword, and that the distance of that adjacent keyword is measured in terms of characters, in this case. An alternative embodiment could have measured it in terms of whole words, but in this case we have shown an example wherein the measurement of distance is in terms of characters.

Notice how each keyword is considered for evaluation then a total is made from accumulating the results pertaining to each of the keywords. It might seem redundant to consider the distance in both directions between the same pair of keywords, but when you notice that the distance also includes the length of the keyword being evaluated, the algorithm makes more sense and is not actually redundant. Whereas a method that considers distances in only one direction would still embody the present invention, the method of this figure is even nicer because it self-scales the distance by the length of each keyword.

SOME PREFERRED EMBODIMENTS AND VARIATIONS OF THE INVENTION

Some example scenarios embodying the present invention are described and indicated below. Certain aspects are also identified wherein some of many variations may be easily made, which would nonetheless fit within the scope of the present invention.

Certain lyrical and or musical information from whose meaning display may be made is known herein as musical information. An example of this would be all the lyrics of a song. Another example would be all the notes of a piece of sheet music. Yet another example would be any particular combination of the two previous examples. The musical information consists of distinct portions that could possibly be displayed in more than just one particular order. For example, a distinct portion might be a certain verse or chorus. The exact order in which we have chosen to display distinct portions shall be known herein as the sequence. The sequence shall indicate a list of said distinct portions in the order in which they are to be displayed. Said sequence may or may not indicate more than one instance of any particular one of said distinct portions, and furthermore it may or may not indicate a representative instance of all distinct portions of said musical information. For instance, you might decide to perform (display) verse 2 twice and skip the third verse. The sequence in this case would twice indicate the distinct portion pertaining to verse 2 and it would not indicate the third verse.

Performing the Sequence:

Said sequence is predetermined prior to performance. The projectionist should have possession of said sequence prior to performance. When performance is made, the projectionist performs the display of the sequence by a plurality of instances of particular action to command a technology embodying the present invention to advance the sequence step within said sequence, such that each of said instances of particular action causes said technology to look up, load and display the particular one of said distinct portions that corresponds to each said sequence step. For example, whenever an overhead software program operator hits the "Page Down" key, the next verse or chorus in the sequence is displayed upon the screen; (and by "next", I mean whatever portion happens to be indicated by the next step of the predetermined sequence, whether or not said portion is proximate to the portion indicated by the immediately preceding step of said sequence).

As a working of this scenario, consider the input file formats for the working program entitled Home Group Overhead (HGO). (This sequencing capability within the HGO program is fairly new, and preliminary copies of the version of HGO that performs such capability were made available to some for beta testing after the provisional version of this patent application was filed.) FIG. 1 shows a hypothetical song lyric file. FIG. 2 shows a single line of a hypothetical song list file, which implements a format for the sequence mentioned above. To perform the first verse, the chorus, the fourth verse and finally the third verse, the computer operator merely needs to keep hitting the Page Down key whenever he has just begun to sing the last word displayed on the screen. When this happens, the appropriate song portions are displayed in the prescribed order, showing only the specified verse or chorus at any one time.

Sheet Music with Words:

An example of a perfectly valid variation of the present invention involves the overhead display of lines of sheet music along with lines of lyrics. Therefore as a variation of the example above, if the program was told to show the sheet music then it prints the words of the particular verse (or portion thereof) nice and big, and positions the notes of the sheet music to align with the syllables of the words, rather than trying to align the words with the symbols of the notes of sheet music.

This allows the words to be shown very large, which is compatible with the modern worship overhead projector paradigm. FIG. 3 shows the first line from a first verse of a hypothetical hymn. FIG. 4 shows the first line from a second verse of the same hypothetical hymn. Notice how the horizontal placement of the sheet music notes. (320, 420) is adjusted to fit with the syllables (310, 410) of the large printed text, and how the horizontal spacing of sheet music notes (320, 420) differs from verse 1 to verse 2 according to the same difference in spacing between words of the two verses. (A version of HGO making visible the sheet music aspect of the sequencing capability has not yet been released to beta testers.) While this use of large unbroken words is compatible with the modern worship overhead lyric display paradigm, the sheet music display is of course also compatible with the hymnal paradigm of traditional worship venues. Thus there is a robust solution to bridge the chasm between modern and traditional worship paradigms. To provide for such a flexible and allignable display of sheet music symbols, templates (such as found in FIG. 5) are made for use in copying and pasting individual musical symbols (520) onto staves within a virtual screen. The staves are groups of five lines drawn on the virtual screen. A variation is to display two staves, with a line of words between them, such as a treble clef and bass clef staff system commonly used for "SATB" choral music. Another variation is to display two related staves, one for each of two simultaneous parts, and where each of the two related staves has its own words above or beneath it. A further variation is to combine these two, such as (but not limited to) wherein the sopranos and altos (or "women") sing the treble clef notes with their own words above or below, and the tenors and bass (or "men") sing the bass clef notes with their own words above or below.

Mechanics of Preparing Display:

A typical embodiment of the present invention is to first draw the staves upon a virtual screen, then print a line of lyrics beneath it. The musical data for displaying the line of the verse is loaded from two bodies of data, in this instance from two files. One file is the equivalent of a midi file, which conveys the notes, their starting positions in time and their durations. This data is loaded into a notes collection. The second body of data is in this instance a file holding the syllables of the words to be displayed. This data is loaded into a syllables collection. The element count of the notes collection is equal to the element count of the syllables collection. The syllables collection contains punctuation that tells the program which adjacent syllables go together into each big word. The punctuation is stripped (in most cases) leaving the whole word to be printed unbroken onto the virtual screen just above or below the five lines of the stave. The program tests the TextWidth (as in Visual Basic) of each syllable as it encounters it, such that it consequently knows the exact horizontal location of the beginning and the center of each syllable along the stave.

The program then copies the appropriate note symbol that pertains to the correct note duration from the template (FIG. 5) onto the stave at the best horizontal position available corresponding to the horizontal position halfway between the start (left) and the center of each syllable of words. The vertical position of this pasted symbol placement is according to the musical note being played, such that the note is viewed as portraying the correct note upon the staff. (If accidentals are required they are copied from the template and pasted in at the appropriate vertical position for the same note, just to the left of the note symbol placement). A variation is to select a precise spacing for the note symbol within the note syllable's horizontal span to accommodate easier spacing between note symbols, where the correlation is still clear between the note symbols and the word syllables, and where the word syllables are not broken up. Then the program draws the appropriate vertical lines (note sticks) coming up or down from each of the note symbols, depending upon whether the stave containing them is above or below the printed words to which they pertain. As any note stick approaches the vertical limit of available virtual display space for that particular line, the vertical length of the note stick is accordingly reduced to avoid overwriting another line's space or going off the virtual screen. In such case there is still a minimum allowable distance from the note stick free end to the (round) note symbol.

According to the rules well known in the art for good note bundling in conventional sheet music notation, it is determined whether the notes shall be single flags or bars, and if bars, how many and which notes are grouped into each note bar grouping. Then the bars are drawn as appropriate thickness lines onto the virtual screen from first note stick free-end to last note stick free-end of each note bar grouping bundle. Then appropriate ASCII symbols are printed in appropriate font sizes and locations to finish preparing the line of sheet music upon the virtual screen. (When the preparation of each virtual screen full is complete it may be admitted to a display to be seen by worshipers). The end result is a complete line of sheet music such as found in FIG. 3 and found in FIG. 4.

In cases where the note symbols (640) for two syllables (610) are unavoidably farther apart than the spacing between normally printed syllables, such as in the case of a note duration indicated by two notes tied (630) together (for instance across a measure line or even from one line to the next), a dash follows each spatially separated preceding syllable within a word, just as you would find in conventionally printed sheet music. (See FIG. 6.) Ties between note symbols (630) may be drawn as an arc of an ellipse, which is well within the power of many graphic subsystems. Because only one verse for each line is displayed at a time, the words of the verse are thus able to be printed very large upon the virtual screen and the notes of sheet music are made to fit the horizontal spacing of those words. The exact horizontal spacing of the same line in a different verse would of course likely be slightly different. In each case, we are able to print the words much larger than we could print them if we had to include all the verses, since nearly all the words are displayed unbroken, with no spaces between their syllables. Also within the scope of the present invention would be to print part of one verse at a time of the words, but with the more conventional practice of printing the note symbols of the sheet music aspect according to their timing, rather than to fit the syllables of the words. Even so doing would still save space at least vertically and allow the printing of words larger on the screen than otherwise possible. Overall, this aspect of the present invention as clearly taught herein provides a powerful functionality to facilitate reconciliation between the "hymns people" and the "modern worship people", because each camp gets to see what they need in order to sing together confidently.

The Timing of the Sequence:

Now we turn to the aspect of accommodating the live timing of the sequencing. Either said performer, said projectionist or both are almost always live person(s), not just recording or automata. Whether said projectionist is human or machine, nonetheless the timing of said projectionist shall be based upon of the timing of the performance. Whether it is a human projectionist displaying a sequence in time to either a recorded or automated performance, or whether it is a human projectionist displaying a sequence in time to a live performance, said human projectionist shall perceive the timing of said performance and appropriately command the advance of said sequence steps.

Automation to Detect Sequence Timing:

In the case of a technological (non-human) projectionist, said projectionist may base its timing upon an automated observation of live human performance through recognition of timing and or notes that said live human performance may comprise, whether said timing and or notes are received via midi, sound or any other communication channel from the live human performer(s). One example of the latter would be a performer toe tapping the beat. Another example would be a programmatic implementation of a phase lock loop system based upon (piano, guitar or drum) microphone output(s) or keyboard midi output(s). Another example would be note and or chord recognition combined with any of the above examples, where said note and or chord recognition data is compared to predetermined recognition data enabling the identification of said distinct portions thereby.

One implementation to enable such is to have audio from performer(s) admitted to a computer's line input jack. Then the live audio stream is peak detected in real time for rhythm as well as spectrum analyzed by electronic circuitry or Fourier transform software for note and chord content. There exist already on the market software that recognize multiple simultaneous musical tones in real time within a single audio channel. The basis for such functionality is well known in the art. Another alternative is to admit the midi data from a keyboard. Yet another alternative is to amplitude detect the drum rhythm, midi detect the keyboard, spectrum detect the rhythm guitar part and spectrum detect the base line, and to prepare a special understanding based upon certain combinations of these inputs. Of these detected inputs the most priority is placed upon the channels specified as belonging to the song leader who is "leading the song". The result would be a list generated upon each beat of those notes deemed as being significantly present.

A way to accomplish the prioritized combining of theses inputs is to mix the analog audio inputs such that the song leader's chord-playing instrument is louder, then noise-gate and auto-level the mix to assure that some data (if valid) is always present, then run the result through the Fourier note recognition algorithm to establish a running total of the [amplitude times time] of each note within each beat, and finally to add to the list of notes present the midi notes played by the keyboardist if present. The amount of chromatic energy (volume times duration) accumulated during each beat shall be the statistical value for each note detected. The estimation for the chromatic energy present may be evaluated by a polynomial expression based upon the durations and amplitudes, where the constants involved in such polynomial expression are predetermined by experimentation prior to or during the performance event's sound check.

The same rules apply to the midi volume and midi duration of notes from the keyboard part. In this case if the song leader is the keyboard player then his recognized midi notes shall be multiplied by a higher value than the recognized notes from the other instruments, but if the song leader is the guitar player then the recognized analog notes will be considered as being more important than the recognized keyboard notes. Then the presence of all the notes are "graded on a curve", which means that the strength of all notes are multiplied by the same common normalization factor, where the common normalization factor is such that the five loudest (most present) notes are perceived as being a certain number of times louder than necessary to be considered as being "active" according to this note recognition algorithm. To accomplish this, the normalization factor is such that the fifth from the loudest note ends up that many times louder than the threshold for note detection. (And rather than five notes it could be some other number of notes).

Having thus input the knowledge to the computer as to what musical tones are playing, the chords are recognized by a 12-bit lookup table (one bit for each chromatic tone present, regardless of octave) and the predominant base line is detected as well. In cases where the result of the 12 bit lookup would ambiguously identify a plurality of possible chords, the "tie-breaker" is the base line. The base line provides an additional 4 bit lookup to further address the 12 bit lookup result, but is relevant only in cases where the 12 bit lookup specifies a plurality of results. The 4 bit lookup from the base line specifies a single one of 12 possible base notes (regardless of octave).

In the recognition of the predominant bass line, the present lowest note is given a medium importance, the lowest note playing when the chord last changed is given a better importance, and the lowest note played most often so far since the present 12 bit value was established is given the best importance. Three prioritized, competing values are thus obtained, where the highest priority is deemed the most likely chord root. Thus there are up to three most likely possible chord roots: the [most often base note], the [present base note] and the [present song segment (chorus or verse) first heard base note]. In cases where these possibilities overlap, the list [of possible 4 bit selected 12 bit addressed chords] is stripped of redundant entries. Thus we have a prioritized list of up to three 16-bit addressed chords made by adding up to three different 4 bit bass line notes to a certain 12 bit recognized chord.

The musical information is searched forward from the last recognized location for each of those (up to three) possible values of the present chord, with the most likely being given a chance to satisfy the search criteria first. The musical information is also given a weighting in search criteria. The very next expected measure or measure portion where the chord is supposed to change is given the very highest rank. Then of lesser rank is the beginning of the present section of the musical information (such as the beginning of this same verse or chorus again), and then of lesser rank than that is the beginning of the present pair of lines, assuming the possibility that the musician decided to break up the present verse or chorus into smaller segments by repeating the last two lines of lyrics in it. Failing a match upon those, the search then seeks forward and back to find the closest segment whose beginning chord matches the present chord being played. Failing that, the search then performs the very same search from the top but up one chromatic step, then failing that the search waits for more input to "get unlost" again. It is also a good variation to multiply or otherwise mathematically combine the ranking of the possible search locations by the ranking of each possible 16 bit specified chord to derive a total probability for each search position to satisfy each likely present chord, and then to select the highest value possibility as the scenario understood to be taking place, thus allowing for a best match rather than merely a first taken adequate match to satisfy the search.

The timing of transition from one chord to another is recognized by the changing of the detected chord. The tempo is detected by software implementation of phase lock loop (by audio peak detection and or midi actuation) that programmatically fills in missing pulses and maintains accurate concepts of the number of beats since each chord change, by means of a beat recognition whose master clock has limited flexibility constrained to the general area of the known, predetermined tempo for the musical performance. The center of the master clock's flexibility also has a limited flexibility to be moved from center by the average of the tempos of all measures of music detected thus far, with most weighting being given to the tempos of the measures within the present musical segment and less weighting being given to the measures of preceding segments, and so on.

To accomplish this, weighting rank for each segment is applied to beats therein, thus a few complete measures of a previous segment will have more of an effect than only a few beats of the present segment. This keeps the assessment of average tempo from potentially swinging too wildly at the start of each segment. The exact timing (in beats) of the change of chords is thus detected and is compared to the expected timing (in beats) of the change of chords, resulting in a tightly recognized synchronization between the live performance and the predetermined sequence of said distinct portions of musical information. Included in the recognition of position within sequence is the comparison of present chords to the expected chords for beats equal to or adjacent to the beat understood to be the present beat, such that if an extra beat is lost or gained, the beat difference is forgiven in order to keep the beats aligned with the beats of the sections of the music, according to the timing (in beats) of the changes from one chord to the next.

Furthermore, the example means of methods for aspects above can be reconciled statistically with simultaneous possibilities obtained from other aspects. Distinct recognition of individual parts such as bass part, drums and guitar can be admitted to a technology through more than one audio or information channel. In such case input assigned to be understood as the song leader is given more importance than each of the other band members, but when all the band members except the song leader agree, an automation assumes that the song leader is lost and the band is keeping it together, and goes along with their idea of where we are in the song.

To accomplish this task an automation is simultaneously resolving a concept of song position (position within song) for each band member, as well as an overall concept of song position built by analyzing a composite of all the notes played at once by any and all band members. In such case the number of concepts for where we are in the song is equal to the number of band members plus one. Thus a logic algorithm chooses which concept mentioned above is correct, and all of the display is actuated in accordance with the winner of such logic contest for which concept of song position is deemed to be true.

Similar statistical evaluation may be applied to the notes in chords such that a minority of musical errors or variations would not prevent successful recognition. This is typically most easily implemented by analyzing the root chord in common between the various momentary variations discovered, such that the root chord is that aspect (those chord elements) of the chord that are present over 70% of the time that the present root chord is valid.

The base line recognition plays a key role in detecting the transition from one root chord to another. Whenever the recognized base line is incompatible with the understood root chord, the root chord is considered as having been changed. Furthermore, the expected duration of the present chord (in beats) is considered as well in the detecting (and forgiving if need be) the variations in detected momentary chord. Provided that the majority of elements of the momentarily incompatible chord are found in the root chord then whenever only one or two beats out of a portion is deemed incompatible with the presently expected root chord, but the proper root chord is once again restored prior to the end of the expected present portion's duration then the off chord moments are simply forgiven as "passing tones" and the song is considered to still be properly on track, because root chords expected for present song positions are being properly followed, albeit with minor human imperfections. This of course requires a planned chord sequence to be known.

Additionally, speech recognition may be used to detect surprising sequence steps of performance by comparing detected lyrics to known lyrics of present sequence steps. Such act of comparison can implement a statistical approach to compare the degree of similarity of recovered text of recognized words to the known words of lines of musical information corresponding to present portions, choosing as the identified result the greatest similarity. Furthermore whenever such similarity exceeds a predetermined percentage of similarity necessary to indicate sufficient confidence, the song position recognized by such speech recognition may be allowed to automatically adjust the understood song position however many beats is appropriate as a result. (Logical decision algorithms found elsewhere in this teaching should enable one skilled in relevant areas of the state of the art to implement any necessary statistical comparisons of lines of text). The various kinds of recognized input (such as results from beats, chords and words) may be combined for the greatest possible certainty of song position. An ambiguous song position assessment according to one kind of input may be narrowed down to a single location by the information from another kind of input. For instance, the chords may be those of any particular verse, but the words would tell us which verse is being sung. And the exact present beat within a verse can be determined by the timing of chords in their beats so that even if the words of a verse are being sung late, the song position will still be accurate to the beat.

Coping with Unexpected Locations:

Now we turn to the aspect of coping with nontrivial sequence anomalies. According to the present invention it is possible for the projectionist (live or automata) to recognize when a performer has deviated from a present sequence and to input into a technology comprising the present invention a command to identify the sequence step surprisingly reached, thereby causing such a technology to jump to the appropriate sequence step, from whence it could subsequently proceed as if it had reached said surprising sequence step through the proper order of execution of said sequence.

One way of accomplishing this process is as follows. The projectionist clicks on the line of lyrics that is surprisingly being sung. The technology looks ahead to find the next sequence step containing that line. If it does not find it, then it looks backward to find the latest sequence step that contains that line. Once it finds the sequence step containing that line, execution of the sequence proceeds from that sequence step.

As mentioned previously, there are additional aspects of problems to be solved by the present invention, which include the following. What if a performer decides to depart from the predetermined sequence? What if a performer decides to make up his own words on the spot during performance? What if a performer decides to not only change the order of parts of a song, but also decides to suddenly start singing part of a different song altogether?

Whereas at first glance these might seem to be new problems necessitating a whole new invention, they are actually aspects of a same overall problem: namely, displaying lyrical and or musical information during performance when unknown and or unexpected aspects of performance such as timing and or content have an effect upon necessary display. Therefore a well considered solution to such an overall problem may incorporate ways of dealing with such variations of the provided scenario.

For such purposes, below is a list of options that may be combined into alternative embodiments of the present invention. While a totality of options below may serve to embody the present invention, it should be understood that any combination of any number of the following steps should also be considered as alternatively and nonexclusively exemplifying the present invention as well. Thus each successive step and or clarification should additionally and optionally be understood as being prefaced by the phrase "additionally or optionally" followed by a comma, semicolon or other such delimiter. By use of such language herein I can at least indicate a large number of possible combinations that should serve as some example embodiments of the present invention. Some listed options are more complex in logical concept than others. I have broken down some complex logical concepts into simple ones herein. Because obvious logical concepts and processes are readily translated into programming language code by one skilled in the art, I have not gone to any unnecessary lengths of coding such herein into each (or any) programming language [into which such logical constructs may be translated]; therefore they stand as logical concepts presented in plain English. This is for both clarity and brevity.

1. When a performer (or group of performers to be called "a performer") sings words (to be called herein "strange words") that do not fit the present lyric being displayed, the projectionist types the strange words into a special window that immediately admits those words to the screen for display. Until the projectionist can type the words and hit enter, a variation is for speech recognition to "take a shot at it". If the projectionist likes what the speech recognition has achieved he can ratify it by hitting enter.

2. Such strange words are then compared to a database of words that have already been encountered and catalogued.

3. Such act of recognition comprises recognizing and replacing each word with a number called a token (such as but not limited to for instance a long integer (DWORD)).

4. Such act of recognition comprises a logic algorithm to determine the most likely match between lines sung and lines within the catalogued words.

5. Such logic comprises a statistical evaluation wherein the length of each word is considered such that the longer words are given more weight in finding likely match.

6. Such logic comprises a statistical evaluation wherein the function of each word is considered such that the most common words are given less weight in finding likely match.

7. Such most common words could include "glue" words like "the" and "and".

8. Such logic comprises a statistical evaluation wherein the presence of all but the most common words (or glue words) is searched, such searched words being called keywords.

9. Such logic comprises a list (for each keyword) of the catalogued lines containing such word, where such list is precompiled and amended as required.

10. Such list is tokenized such that each song (lyric) is given a numeric identity.

11. Such list is tokenized also such that each line (within each song lyric) is given a numeric identity.

12. Such logic comprises an evaluation wherein consecutively adjacent words are given greater weight in the match than such words being merely present yet not consecutively adjacent, where such evaluation is compiled upon demand regarding the line of words presently detected as being performed, and furthermore such evaluation is precompiled and amended as required in regard to the reference data pertaining to known lines of known songs. Each such profile consists of an indexed tokenized list of keywords in their order of appearance in the line of words, with a value for the distance from each keyword to the one before it and the one after it. Thus omissions and errors of glue words will only degrade the accuracy of distance values for the keywords immediately adjacent on either side of the missing words. Certain of the following options may be done in series to progressively cut down an extremely large list of lines to just several or even a few, while performing the most complex of operations only upon the smallest number of lines.

13. A larger list of lines is compared to the sung line where each line therein may or may not be called a "library line" while it is being compared to the sung line. Such larger list is cut down to a smaller list by looking up every keyword in the larger list in a hash table that lists all the lines containing any keyword. A list is thus made of all lines containing any keyword of the sung line. But this list of lines is made as a collection where the index of the line is the key, thus each line can only be listed once.

14. A larger list of lines is compared to the sung line where each line therein may or may not be called a "library line" while it is being compared to the sung line. Such larger list of lines is cut down to a smaller list by looking up the first three keywords of the sung line in an indexed hash table that lists lines containing as their first, second or third keyword the keyword pertaining to the hash table index. Thus there is a smaller list to consider now where each line on this smaller list has either the sung line's first, second or third keyword as its first, second or third keyword.

15. A larger list of lines is compared to the sung line where each line therein may or may not be called a "library line" while it is being compared to the sung line. Such larger list of lines is scanned. A collection of keywords is made for the sung line where the item data is the long index in such collection and the string key is the keyword. A two dimensional array is dimensioned whose first dimension size is at least two, and a first location along such dimension stores the line number being searched. The second (non-line-number) ("incrementable") location along such is incremented each time a keyword is found. The second dimension size of the array is equal to length of the list of lines to be searched. Each word found in each line to be searched is evaluated. Each time a new line is begun for consideration, the index of the array in the second dimension is set to the value pertaining to the line being searched. An answer number is set to zero immediately prior to each word in the scanned line being used as a key to search the collection, and the answer number is made to equal what is retrieved from the collection. Each time the item data returned is valid (non zero) this indicates that such keyword was found in the sung line and the incrementable cell in the array for that line being searched is incremented. If the returned value is zero then the incrementable cell in the array for that line is decremented. Once the entire line has been searched thus, the total for the incrementable cell in the array for that line is left containing the total number of matching keywords for that line, minus the number of keywords in that line missing from the sung line. Then after all the lines of the large list of lines has been searched, the array is searched for a certain number of lines that have the highest number in the incrementable cell in the array. If that certain number is ten, then we end up with a list of the ten lines that have the most keywords in common with the sung line and the least number of keywords missing from the sung line.

16. A larger list of lines is compared to the sung line, where each line therein may or may not be called a "library line" while it is being compared to the sung line. A keyword direction profile is prepared for each line of such larger list and of the sung line. The keyword direction profile consists of a list of the keywords present within the line, and for each such keyword, how many keywords are to the right of it and how many keywords are to the left of it. If a certain keyword is used more than once in a certain line, the numbers for how many to the right and to the left are added together for each instance of the same keyword. This gives a numerical indication of the particular keyword placement within each line. Then for each keyword shared in common between the library line and the sung line, there is a keyword direction difference made by taking the absolute value of the difference between the library line and the sung line's value found for the [number of keywords to the right minus the number of keywords to the left]. That keyword direction difference is added together for each keyword they share to derive a keyword difference total, then the total number of keywords not in common between the two lines is added to this keyword difference total. Finally the total number of keywords found in common is divided by a number made by adding a small number to the keyword difference total, yielding a keyword difference ratio. This keyword difference ratio is the score given for each line to numerically express how similar the exact order of keywords is between that particular library line and the sung line. Then a smaller list of lines is made by listing the ten (or some other such number) best keyword difference ratio scores, indicating the most similar lines. The list may also contain the actual ratio scores as well as the lines to which they refer. Variations upon this algorithm are permissible provided that they still yield a better score for those lines whose order of keywords is more similar to the order of keywords in the sung line.

16. A larger list of lines is compared to the sung line, where each line therein may or may not be called a "library line" while it is being compared to the sung line. A statistical comparison may be made by adding together a "weighted similarity score" for each keyword shared by the two lines being compared, and subtracting from that total a "weighted absence score" for each keyword present in the library line but missing in the sung line. The preceding distance is the distance from the last letter of a keyword to the last letter of the preceding keyword (or if it is the first keyword, to an imaginary position a little before the beginning of the line). The following distance is the distance from the first letter of a keyword to the first letter of the following keyword (or if it is the last keyword, to an imaginary position a little after the end of the line). The preceding similarity score is made by dividing the preceding distance of the keyword in question within the sung line by a value equal to a small number plus the difference between the [sung keyword preceding distance] and the [library keyword preceding distance]. The following similarity score is made by dividing the following distance of the keyword in question within the sung line by a value equal to a small number plus the difference between the [sung keyword following distance] and the [library keyword following distance]. The weighted similarity score for each keyword is then made by adding the preceding similarity score and the following similarity score for that keyword. The "weighted absence score" for any keyword within a library line is equal to what the weighted similarity score would be for that keyword if it were found within the sung line and if the preceding and following distances for that keyword were a perfect match between the library line and the sung line. The total similarity value for a comparison of two lines is made by adding together their weighted similarity scores and subtracting any weighted absence scores they may have. FIG. 7 shows a simple example of line comparison according to a particular embodiment of the present invention. The statistical comparison produces a list of the several library lines most similar to the sung line. It is important to understand that this is just one embodiment of the aspect of the present invention that deals with a comparison between a line of text and library of known lines of text. The present invention is also embodied by any implementation that grades the similarity between an input line of text and each [line of a body of known lines] ("library line") of text by accumulating a favorable indication for each keyword shared in common [between input line and library line], where said favorable indication is (linearly or nonlinearly) proportional to a degree of similarity [of distance from each keyword to adjacent keywords or line ends] between input line keyword and library line keyword, and by accumulating an unfavorable indication for each keyword missing from the input line as compared to the library line.

17. A series of consecutive options above may be performed where a plurality of options (such as options 15 and 16) may be performed upon the same larger list to reduce to two alternative smaller lists, each with their own priorities. In such case the number of allowable results obtained from each option may be much larger (perhaps a couple hundred rather than ten or twenty) and then the intersection of the two lists resulting from the two options could then be prioritized according to a polynomial equation that inputs the ranking values obtained from each of the two options, and thus create a prioritized list of the most likely lines, the top priorities thereof would be considered as a short list result.

18. A display may be made, where an action of a human interface functionally could select from among a list of alternative lines resulting from options above. Such display (and or corresponding information) of most likely results could be called herein a jump table.

19. Selecting one item of such jump table could result in jumping to a particular line within a particular lyric corresponding to such selected jump table item.

20. Jumping may cause a first item of a further such jump table to be a "back" item that corresponds to the action of returning to where one was before said jumping.

21. A jump history may be remembered such that it is possible to return from many nested jumps, and where upon returning, the previous "back" item is a first item of such table.

22. In addition to lyric lines being searched for context to sung (typed) words, there may also be a window for scripture that has context to such sung words.

23. It could be possible to jump to lines from a scripture table.

24. In addition to word match (for lyrics and or scripture) it may be possible to match also by predetermined thematic or semantic similarity, such as for instance by Thompson cross reference or by strongs greek or hebrew words.

25. When any line is jumped to, the full context of such line is loaded and displayed as if the line had been arrived by proceeding from the beginning unto the present line, according to standard sequence thereof.

26. When "next sequence step" command is issued after jumping to a line not contained in the previously loaded lyric or scripture, the movement to the next sequence step shall be like such as disclosed previously in regard to the present invention as pertaining to jumping to an unexpected line within the same lyric or musical information set; namely that the sequence shall proceed from there as if that location had been naturally attained by proceeding though the predetermined sequence standard (or predetermined) for such lyric and or musical information.

27. Voice recognition can take the place of typing in words of lyrics.

28. The step of selecting the correct item from the jump table of most likely jump locations can be assisted, narrowed down and or automatically determined by recognizing the musical chords occurring during the strange words, such that the likely song lyric lines shall be still considered as likely only insofar as the chords played during such strange words correspond to the chords looked up (from within the repository of musical information for all known songs) as pertaining to the song whose line is being considered as likely.

29. By using both voice (words) recognition and musical (chords) recognition in this manner, the system could jump to the correct line in the correct unexpected song without human intervention.

30. If the system has made preliminary decisions based upon speech recognition, the decision process may be redone upon human (typed) input (whenever available). Thus a projectionist functionality could be configured such that a human could ratify the automation's decisions by simply not correcting them.

31. A "sung line" may actually be a line indicated by other than singing.

32. Certain aspects of calculations above may be pre-calculated.

DISTINCTIONS AND DEFINITIONS

While I have mentioned human interaction with functionalities of the present invention, it should be understood that methods of the present invention comprise ways of responding to human action rather than including any human action itself. Furthermore, upon mention of live performance, it should be understood that what is claimed is method(s) whereby a system could cope with live performance whether said live performance is real, missing or imagined. In other words, a live performance is not part of the present invention but rather a significant aspect of potential problems the present invention is intended to solve. And the mention of human interface functionality does not necessarily imply a functionality completely separate from other functionalities. It is also allowable within the intended understanding of the present invention for a functionality to interact with a functionality that comprises it, (just as it is valid to say that I can scratch my head, or that I can be scratched by my fingernail).

Any interpretation of any descriptions of the present invention should allow for such an understanding.

For purposes of this patent, any list of definitions of "library line" should at least include "any line of a plurality of lines being compared to a particular line". For purposes of this patent, any list of definitions of "projectionist" should at least include "any human or automation who performs projection". For purposes of this patent, any list of definitions of "projectionist functionality" should at least include "any functionality intended to be used for projection or any functionality intended to be used to prepare display such as would be projected". For purposes of this patent, any list of definitions of the root verb "project" should at least include "post visually upon or within any personal or public visual display device", and any of the various forms of this root verb "project" (such as but not limited to "projecting", "projected", "projector" and "projection") should be understood according to an appropriate list of definitions including this definition.

For purposes of this patent, any list of definitions of "human interface functionality" should at least include "any functionality normally intended to impart, communicate, conduct, convey, receive or otherwise admit any information and or timing at any particular time from any human, where such functionality may include but is not limited to keyboards, touch-pads, mice, switches, speech recognition equipped live audio channels, frequency recognition equipped live audio channels and any means through which a live human could possibly provide non-predetermined information and or timing". It is possible that a human interface functionality could be commanded by automated and or prerecorded musical performance (or timely delivery and or consideration of essential data thereof), provided that methodology of such human interface functionality is such that it could alternatively be used to process data harvested in real time from live human performance (whether or not such alternative live human input happens to be implemented). Thus a time scheduled display found in the karaoke paradigm would not in and of itself be considered an example of human interface functionality, because whether or not such ability is actually utilized by a live human being, a necessary property of "human interface functionality" is the ability to convey, accept, or recognize in real-time (or respond in real-time to) unexpected aspects of detected input such as (but not limited to) keystrokes, mouse movements, clicks, switch closures, choices, notes, chords, words and or timing (whether or not any device or device driver directly or indirectly conveys such detected input). An example of a non-device driven human interface functionality would be passing a real time memory resident audio stream through a functionality that would alternatively or normally be used to analyze audio input from a microphone input channel, as the analytical functionality has not yet memorized in advance ensuing aspects that in real time it shall determine are present within such real time audio stream; especially considering that (whether or not a microphone is even present) such human interface functionality is still such that a human performing into a microphone could teach a system the timing and choice of said aspects in real time whenever such human interface functionality were attached directly or indirectly to such a microphone. For purposes of this patent, any list of definitions of "plurality of instances of a certain particular stimulus" should at least include "a plurality of consecutive decisions to proceed to immediately subsequent steps within a predetermined sequence as directed by a human interface functionality", as well as obvious other definitions.

For purposes of this patent, any list of definitions of "sheet music" should at least include "any potentially displayable graphic representation of musical information that would be easily recognized by (at least) someone skilled in the art as being essentially the same thing as a conventionally printed sheet of sheet music or meaningful portion thereof". For purposes of this patent, any list of definitions of "most similar" should at least include "having a numeric result of analysis that indicates greatest similarity (as compared to available alternatives) according to a mathematical formula whereby (according to the needs of the application wherein similarity is being assessed) important aspects of similarity have effect upon numeric outcome". For purposes of this patent, any list of definitions of "virtual screen" should at least include "any field, memory segment or portion of data storage functionality pertaining to, potentially corresponding to or symbolic of an at least two dimensional area, or to which or from which may be copied any portion of any graphic image or visual data pertaining thereto".

ADDITIONAL MATERIAL

The written description inherited from the Parent Patent ends here. From here on, the written description comprises new material. Furthermore, to avoid confusion between the Parent Patent and this CIP Patent, the new figures will start with FIG. 101 and the claims herein will start with claim 101. The present invention disclosed in this CIP Patent may be referred to as "The Latest Invention".

It should be understood that all embodiments of the latest invention outlined, described and or indicated within the specification are intended to be used as examples to convey their underlying principles, rather than as a restrictive list of allowable interpretations. A variety of alternative embodiments is possible and the invention should be understood to be as wide in scope as the language of the claims themselves.

DETAILED DESCRIPTION OF THE NEW DRAWINGS

Figure 8:
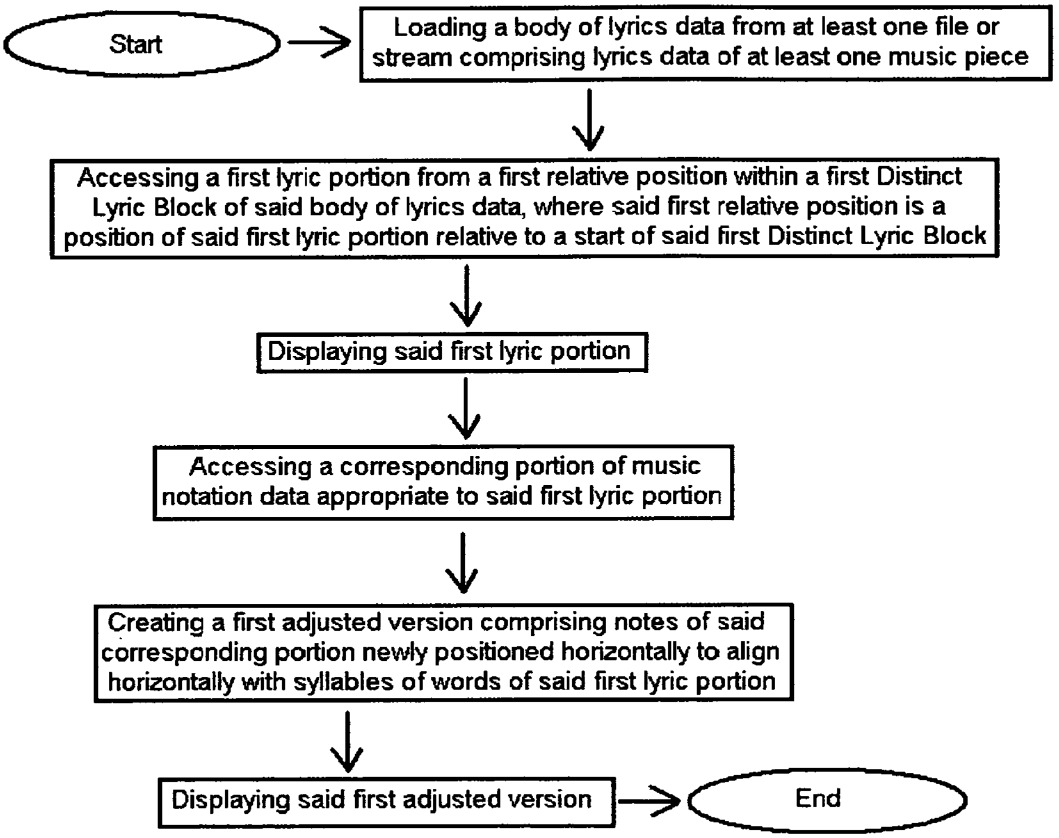
FIG. 8 illustrates a display procedure according to a preferred embodiment of the present invention.
Figure 9:
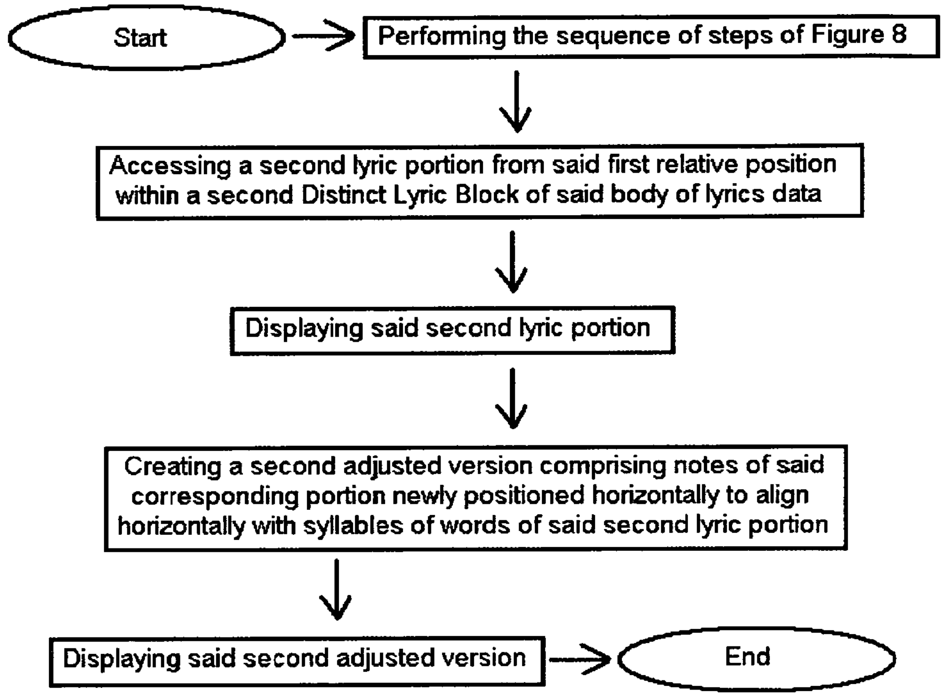
FIG. 9 illustrates a display procedure according to a preferred embodiment of the present invention.
Figure 10:
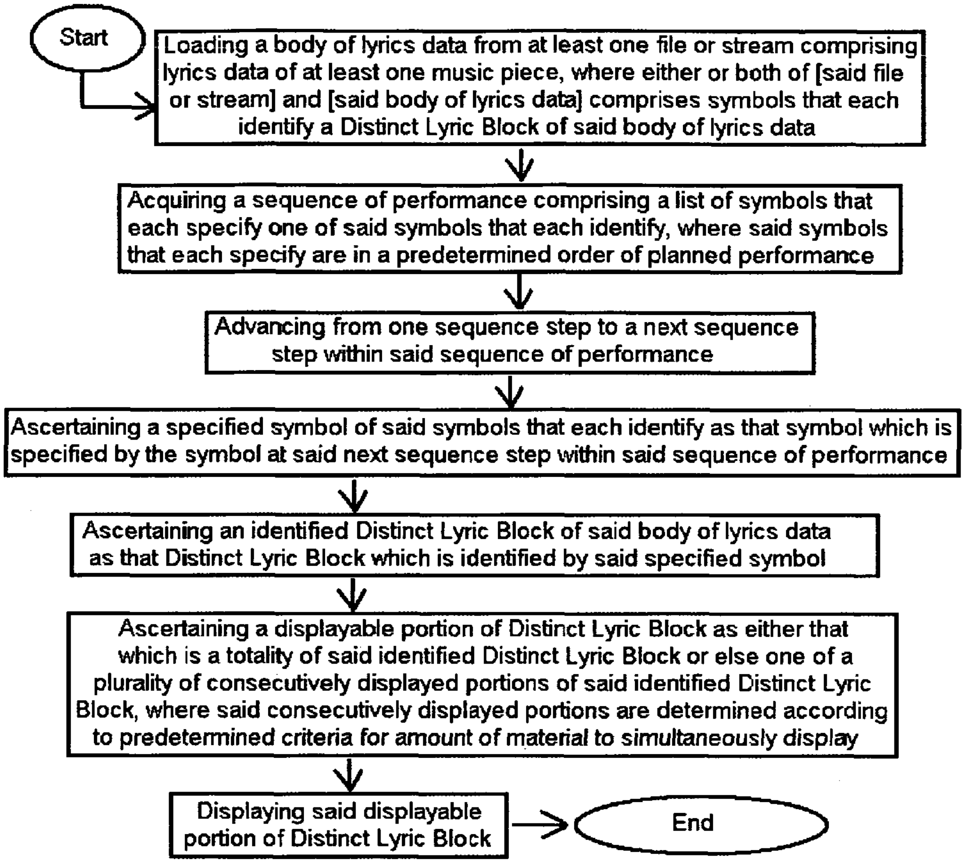
FIG. 10 illustrates a display procedure according to a preferred embodiment of the present invention.
Figure 11:
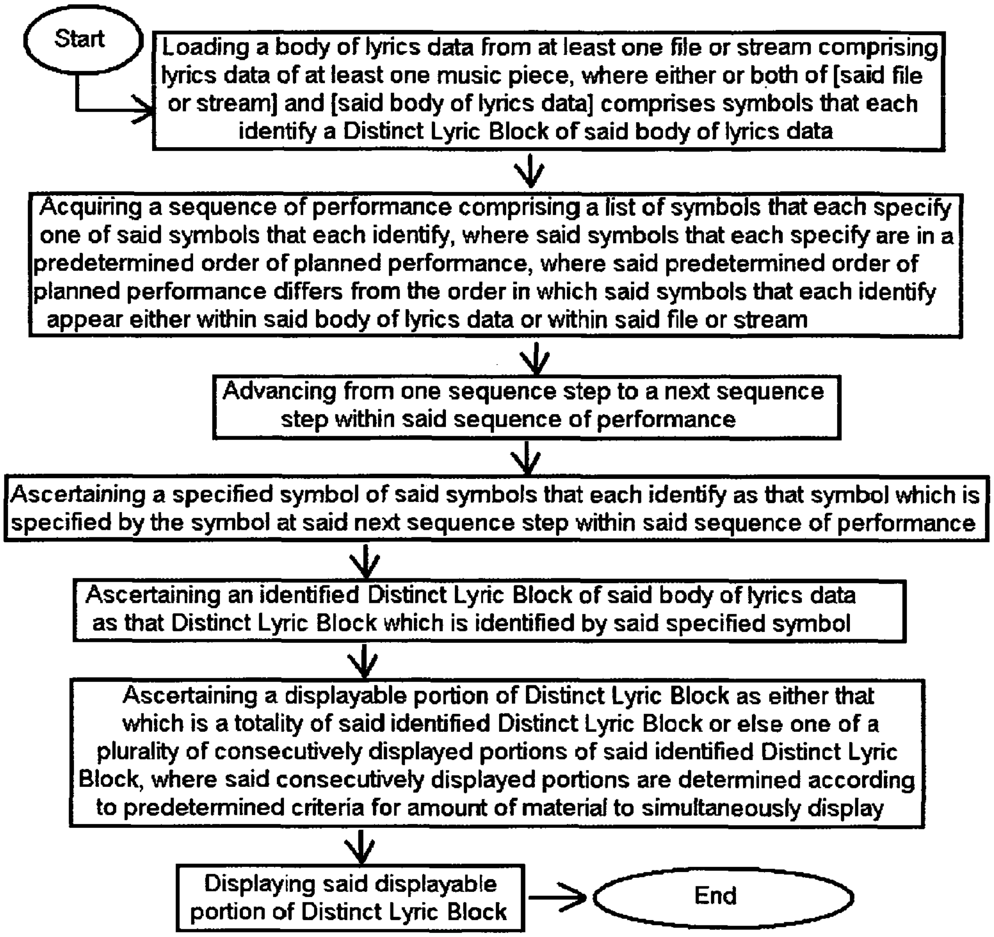
FIG. 11 illustrates a display procedure according to a preferred embodiment of the present invention.

FIG. 8 shows a method step process flow chart for a First Non-Limiting Example Embodiment of the present invention (disclosed further below). FIG. 9 shows a method step process flow chart for a Second Non-Limiting Example Embodiment of the present invention (disclosed further below). FIG. 10 shows a method step process flow chart for a Third Non-Limiting Example Embodiment of the present invention (disclosed further below). FIG. 11 shows a method step process flow chart for a Fourth Non-Limiting Example Embodiment of the present invention (disclosed further below).

Figure 12:
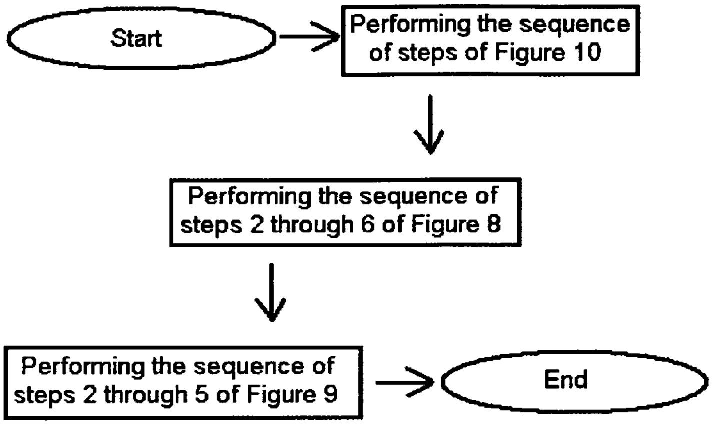
FIG. 12 illustrates a display procedure according to a preferred embodiment of the present invention.
Figure 13:
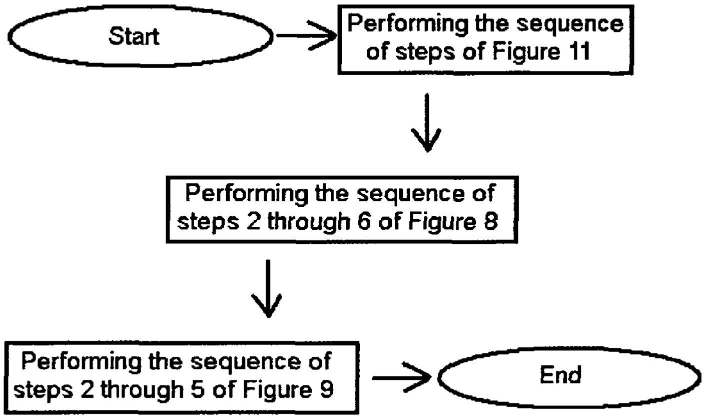
FIG. 13 illustrates a display procedure according to a preferred embodiment of the present invention.
Figure 14:
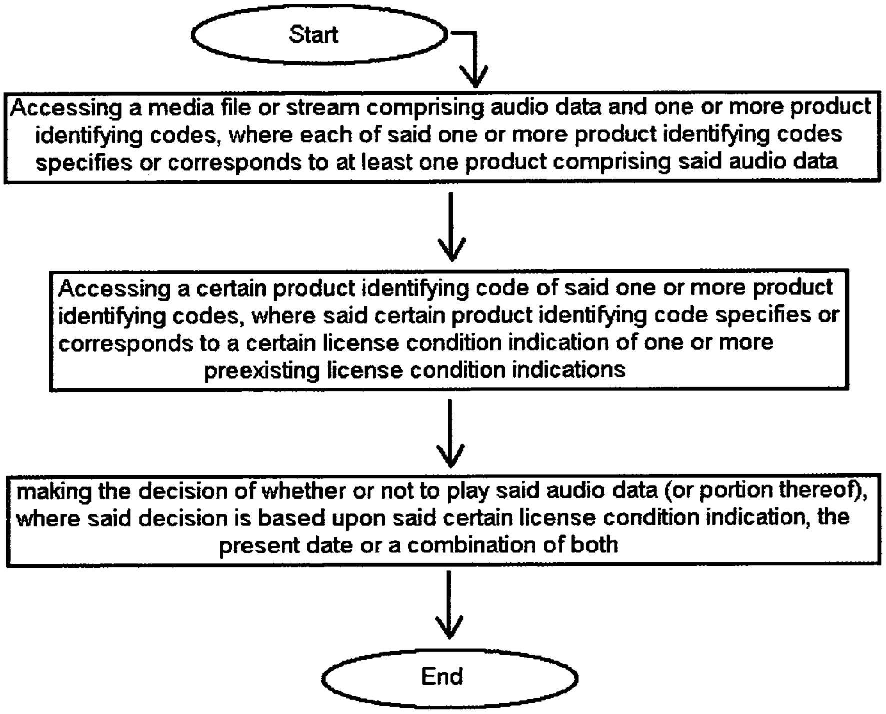
FIG. 14 illustrates a display procedure according to a preferred embodiment of the present invention.
Figure 15:
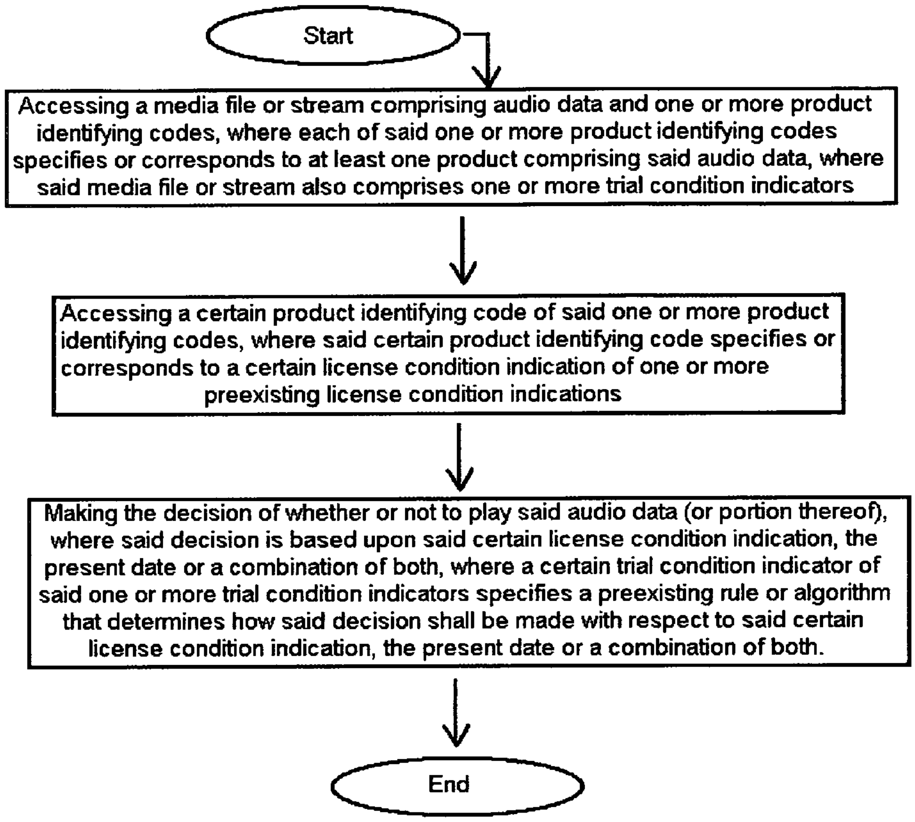
FIG. 15 illustrates a display procedure according to a preferred embodiment of the present invention.

FIG. 12 shows a method step process flow chart for a Fifth Non-Limiting Example Embodiment of the present invention (disclosed further below). FIG. 13 shows a method step process flow chart for a Sixth Non-Limiting Example Embodiment of the present invention (disclosed further below). FIG. 14 shows a method step process flow chart for a Seventh Non-Limiting Example Embodiment of the present invention (disclosed further below). FIG. 15 shows a method step process flow chart for an Eighth Non-Limiting Example Embodiment of the present invention (disclosed further below).

Figure 16:
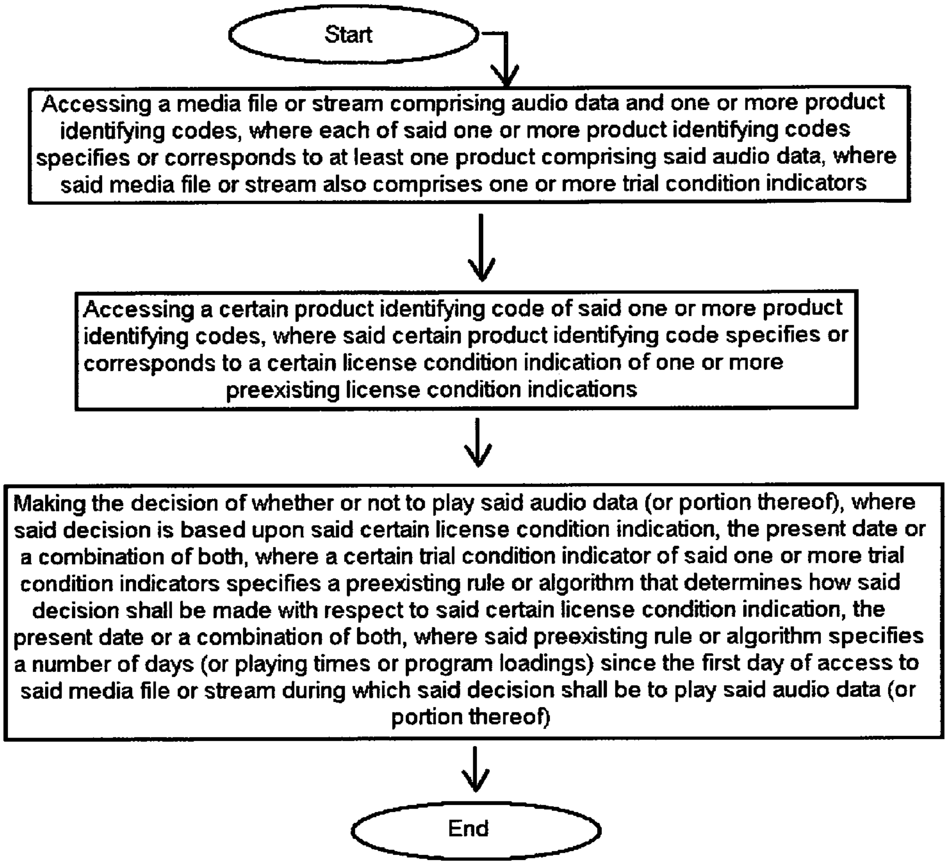
FIG. 16 illustrates a display procedure according to a preferred embodiment of the present invention.
Figure 17:
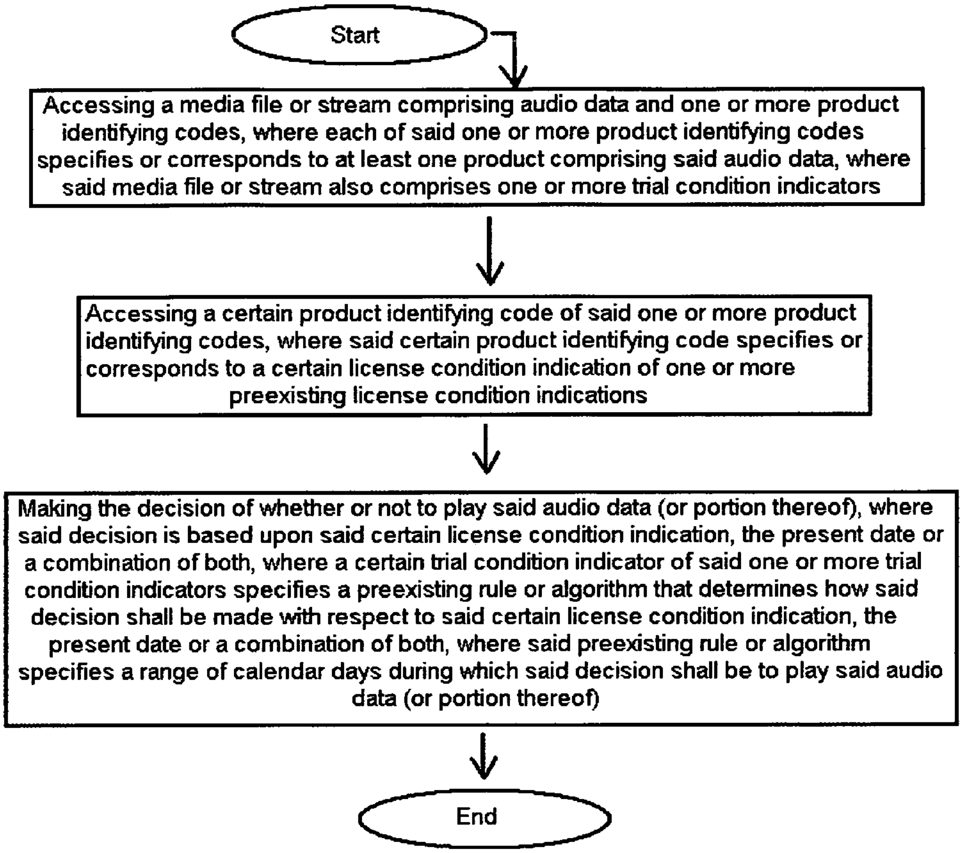
FIG. 17 illustrates a display procedure according to a preferred embodiment of the present invention.
Figure 18:
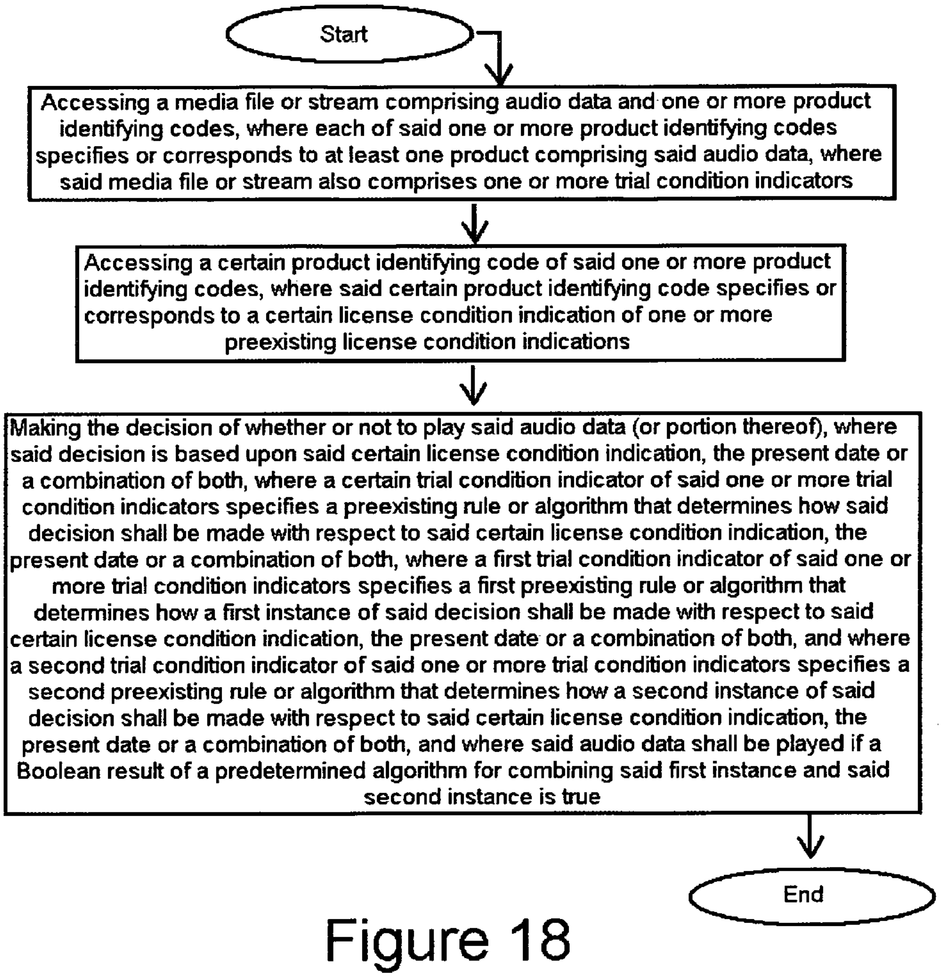
FIG. 18 illustrates a display procedure according to a preferred embodiment of the present invention.
Figure 19:
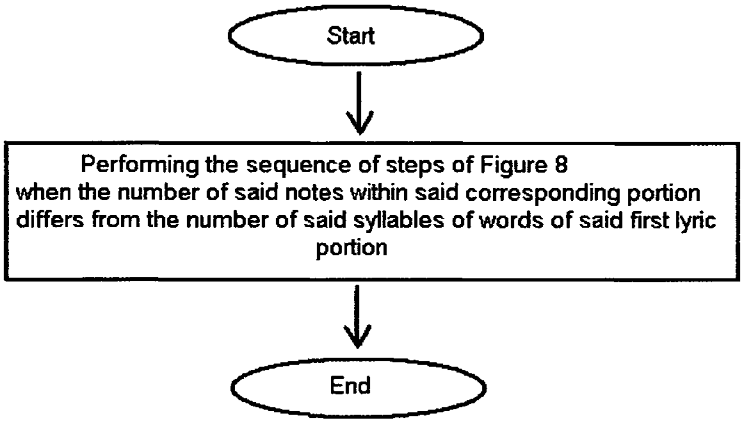
FIG. 19 illustrates a display procedure according to a preferred embodiment of the present invention.

FIG. 16 shows a method step process flow chart for a Ninth Non-Limiting Example Embodiment of the present invention (disclosed further below). FIG. 17 shows a method step process flow chart for a Tenth Non-Limiting Example Embodiment of the present invention (disclosed further below). FIG. 18 shows a method step process flow chart for an Eleventh Non-Limiting Example Embodiment of the present invention (disclosed further below). FIG. 19 shows a method step process flow chart for a Twelfth Non-Limiting Example Embodiment of the present invention (disclosed further below).

Figure 20:
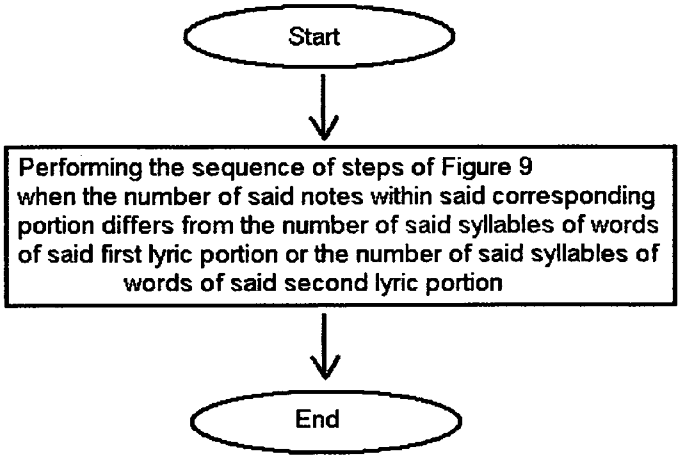
FIG. 20 illustrates a display procedure according to a preferred embodiment of the present invention.
Figure 21:
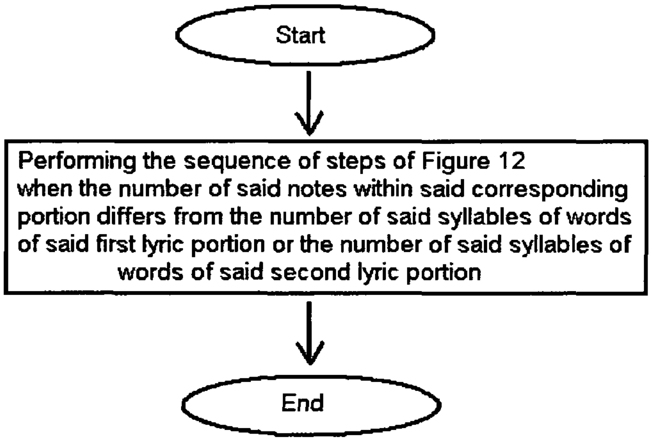
FIG. 21 illustrates a display procedure according to a preferred embodiment of the present invention.
Figure 22:
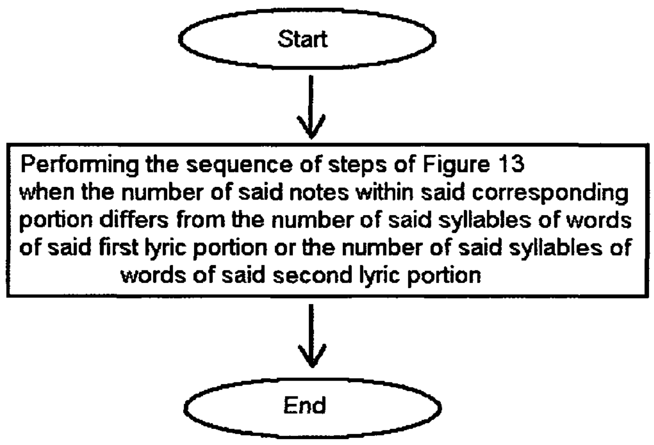
FIG. 22 illustrates a display procedure according to a preferred embodiment of the present invention.

FIG. 20 shows a method step process flow chart for a Thirteenth Non-Limiting Example Embodiment of the present invention (disclosed further below). FIG. 21 shows a method step process flow chart for a Fourteenth Non-Limiting Example Embodiment of the present invention (disclosed further below). FIG. 22 shows a method step process flow chart for a Fifteenth Non-Limiting Example Embodiment of the present invention (disclosed further below). Every detail of these new drawings (FIGS. 8 through 22) is specified by the detailed description given whereby it is understood that each of said new drawings comprises just the steps of corresponding Non-Limiting Example Embodiment of the present invention as cited above. As every detail of these new drawings (FIGS. 8 through 22) has been thus specified, this has been a complete and full detailed description of the new drawings.

SOME ADDITIONAL DEFINITIONS OF TERMS OF THE LATEST INVENTION

A "file" is a file (or equivalent) in a memory, storage device or network accessible resource. A "stream" is a span of memory or network accessible data that is the equivalent of a file. A "body of lyrics data" is data representing one or more lines of text comprising lyrics (words) to one or more songs. A "Distinct Lyric Block" is a distinct block of lyrics from a body of lyrics data, where said Distinct Lyric Block could be a verse, chorus, hook, bridge, intro or ending.

"Lyrics Data" is lyrics in a data form, (usually data representing text). A "lyric portion" is a section (or totality) of Distinct Lyric Block that has a certain absolute location within said Distinct Lyric Block, but also has a relative position. A lyric portion has a certain length, usually measured in number of lines, just as you would count the lines of a poem. A relative position ("relative position") is a position with respect to the start of the Distinct Lyric Block (such as a verse, chorus, hook, bridge, intro or ending) that comprises it. A relative position within a Distinct Lyric Block might be "the first line" or "the second line". In a case where a lyric portion is a portion less than a totality of said body of lyrics data, accessing said lyric portion could mean making access to portion less than a totality of said body of lyrics data. In a case where a lyric portion is a totality of said body of lyrics data, "accessing" said lyric portion could also simply mean providing said lyric portion as an input to a display routine while "displaying" could be an action of a display routine of making available a display output. A music piece is a piece of music that may comprise either of lyrics, lyrics data, music notation data or information specifying music notation data. A start of a Distinct Lyric Block is a location where said Distinct Lyric Block begins within a body of information comprising said Distinct Lyric Block.

Since the relative position is with respect to the start of the Distinct Lyric Block, a certain line can have the same relative position within one Distinct Lyric Block that a different line has within another Distinct Lyric Block. For instance, the second line of Verse 2 has the same relative position as the second line of Verse 3; the relative position being "the second line". Because verses most often share the same music (notation) in a hymn or song, two different lines of a body of lyrics data that have the same relative position will most often have the music (notation) as well. This is very important, because the same music notation data can be used for both verses.

This allows to store just one verse worth of music notation data, which will be "recycled" for all the verses. Whenever a line of lyrics having a certain relative position is displayed, the music notation data pertaining to that relative position is used to make the sheet music display surrounding that line of lyrics . . . and of course, the horizontal alignment of sheet music (music notation) notes is made to fit the horizontal alignment of the words to that line of lyrics.

This makes it possible to show the line of lyrics real big and unbroken, just as we are used to seeing it on a projection without any sheet music (music notation) display. Yet the music notation is there for all who can read music (or who may end up learning to read music merely by being aware of the notes going up and down). "Music Notation Data" is any data specifying information from which one could draw music notation of music: A typical source of music notation data is midi, but it could also be other formats, such as ".mct" (Musicator Format) or ".nwc" (Noteworthy Composer Format).

"Symbols that each identify a Distinct Lyric Block" ("symbols that identify") are any symbols that can be included within a body of lyrics data (or that can be specified by information included within a body of lyrics data), where each symbol would uniquely identify a Distinct Lyric Block. Such symbols could be anything, but it is most convenient for text files of lyrics that the symbols should be combinations of ascii characters. Examples are: "V1, V2, C, B1". According to some embodiments, the letters such as ("v", "c", "h", "b", "i" and "e" could stand for verse, chorus, hook, bridge, intro and ending, respectively; and in such case the numbers following each letter would stand for which such numbered block. If a symbol in (or specified or identified by a symbol or datum within) said body of data identifies distinct storage for a Distinct Lyric Block, then said symbol is still a symbol that identifies a Distinct Lyric Block, by virtue of the fact that the symbol nonetheless distinctly corresponds to the Distinct Lyric Block, thus either directly or indirectly identifying it. Such would be the case where a Distinct Lyric Block (or portion thereof) gets stripped of a symbol but stored in such collection as being keyed (indexed) by said symbol. Such would also be the case if a certain one of a group of generic locations predetermined to be keyable by said symbol (or its equivalent) were filled by said Distinct Lyric Block (or portion thereof). If such a symbol indirectly (by lookup table, sufficient similarity, predetermined equivalence or any other indirect specificity) identifies then it is nonetheless a "symbol that identifies", provided that there is a demonstrable specific correspondence between the symbol and what it identifies.

A lyric portion is a portion of a Distinct Lyric Block. Such lyric portion has a (starting) position within said Distinct Lyric Block. A corresponding portion of music notation data to a lyric portion is a portion of music notation data that pertains to a section of music corresponding to said lyric portion, such that said lyric portion could possibly be sung to a melody indicated by said portion of music notation data. For instance, V1 would in such mean the first verse, and C2 would mean the second chorus. Any time in such case a number is given without a letter it would be assumed to mean a certain verse having that verse number; and any time in such case a letter is given without a number it would be assumed that the number following the letter is "1. Thus in such case, "C" would mean the first (or only) chorus. "Symbols that specify" are symbols that specify such "Symbols that, each identify a Distinct Lyric Block".

Thus the symbols that specify could be exactly the same, or they could simply mean the same thing. For instance, if the symbol "C" identifies the (only) chorus within a body of lyrics data, the symbol “C1” could successfully specify it, because it means the same thing. A “sequence of performance” (“sequence”) is what specifies the order in which Distinct Lyric Blocks are intended to be performed, said order being called a “predetermined order of planned performance”. The sequence comprises a list of symbols that specify. The order in which the symbols that specify appear within a sequence need not be the same order in which their corresponding Distinct Lyric Blocks appear within a body of lyrics data. (Otherwise there would be no need for the sequence). Said “predetermined order of planned performance” may either directly or indirectly correlate to their order of placement within a storage structure; but as long as they are accessed within said predetermined order of planned performance then it may be accurately said that “predetermined order of planned performance” is the order in which said symbols that specify appear (either directly or indirectly) within a sequence. In other words, the order of appearance of symbols of a sequence should be understood to be their temporal order of accessing rather than strictly their order in placement within a storage structure. The most direct and most simple storage structure is a simple series of said symbols that specify. A less direct but just as valid storage structure would be a series, collection or grouping of said symbols that specify, where other data specifically indicates the order in which the elements of said series, collection or grouping should be accessed or understood, thereby establishing a normal (or usual) temporal order of accessing of said symbols. For instance, there could be two collections, one that stores or indexes said symbols that specify, and another collection that indicates an order in which the members or elements of said one which stores or indexes should be accessed. Thus an obfuscated or indirectly ordered storage structure of said sequence does not negate the fact that whether directly or indirectly, said sequence comprises a list of symbols that specify and that said symbols that specify are either directly or indirectly in said “predetermined order of planned performance” within said sequence, as said order is temporal (according to a normal playing of said sequence) rather than necessarily by direct linear placement within memory or other such dimensions.

Advancing from one sequence step to another is to consecutively access the symbols of said list of symbols that specify; in order to perform operations based upon each symbol so accessed (each symbol at said next sequence step), such as looking up or ascertaining symbols specified by said each symbol so accessed. An identified Distinct Lyric Block is a Distinct Lyric Block identified by one of said symbols that each identify.

A displayable portion of Distinct Lyric Block is either that which is a totality of a said identified Distinct Lyric Block or else one of a plurality of consecutively displayed portions of a said identified Distinct Lyric Block, where said consecutively displayed portions are determined according to predetermined criteria for amount of material to simultaneously display. Such criteria could be a decision to display just one line or just two lines or just however many complete lines as will fit in the display area.

An adjusted version comprising notes and syllables of words is a version of displayed or displayable music notation comprising notes that are positioned horizontally to align with syllables of words.

A media file or stream is any stream or file comprising media data such as audio data. Audio data is data that represents recorded audio content, such as (but not limited to) WAV, MP3 or OGG. Midi would not be such audio data, because the midi is symbolic rather than recorded. Compressed audio data is still audio data. Even encrypted compressed audio data is audio data. A product identifying code is a code that identifies a certain product. A product comprising audio data is a product that includes audio data. An example would be a record album, CD or downloadable album of audio data or music.

A license condition indication is a piece of information that indicates the licensing status of a product or group of products on a machine or network. For instance, a license condition indication (or lack thereof) may indicate that a certain audio album is brand new and has not yet been played. Or it may say that the album has had a full demo trial and can no longer be played for free. Or it may indicate that this particular album can be played for free during the month of December, every year. Or it may indicate that this particular album is always free, as long as the player is properly operable or properly licensed. The present date is a machine’s best estimation of the correct date. It may be inaccurate, or it may be “fooled” by someone playing with the calendar. In such case it could even be the latest date ever used on the computer.

A trial condition indicator is a piece of information that specifies the preexisting rule or algorithm that determines how said decision shall be made with respect to said certain license condition indication, the present date or a combination of both. It might consider a number of days (such as 14 days) since the first day of access to said media file or stream. It might consider a range of days (such as all the days of December, every year) during which said decision shall be to play said audio data (or portion thereof). One trial condition indicator could specify that the music should not play for more than 14 days for free.

A number of days (or playing times or program loadings) since the first day of access to said media file or stream during which said decision shall be to play said audio data (or portion thereof) is either a number of days since the audio data (or any portion thereof) was first played (or accessed), or (in the case of an obviously manipulated computer calendar) a number of times since then that the program determining such has been loaded.

Another trial condition indicator could provide as an exception, all the days of December, every year. In such case, that would be a range of calendar days (the same range of days every year). It could also be possible to put two trial condition indicators in the sale file, in order to specify how to react to one set of circumstances or another. Then a way of reacting to two results would be predetermined, such that the Boolean answers that the trial condition indicator provide can combine into a single Boolean answer. For instance, the predetermined algorithm could be that any “yes” answer plays the audio. Another could be that any “no” could prevent the audio from playing.

An instance of a decision whether to play said audio data is a particular decision made on the basis of a set of conditions and or rules, where each such instance may be considered along with other such instances to produce an ultimate decision thereby as to whether to play said audio data. For instance, each instance may be governed by one rule specified by one of many trial condition indicators.

SOME PREFERRED EMBODIMENTS OF THE LATEST INVENTION

A First Non-Limiting Example Embodiment of the present invention would be a music and lyric display method comprising the steps of:

loading a body of lyrics data from at least one file or stream comprising lyrics data of at least one music piece;

accessing a first lyric portion from a first relative position within a first Distinct Lyric Block of said body of lyrics data, where said first relative position is a position of said first lyric portion relative to a start of said first Distinct Lyric Block;

displaying said first lyric portion;

accessing a corresponding portion of music notation data appropriate to said first lyric portion;

creating a first adjusted version comprising notes of said corresponding portion newly positioned horizontally to align horizontally with syllables of words of said first lyric portion;

displaying said first adjusted version.

A Second Non-Limiting Example Embodiment of the present invention would be said First Non-Limiting Example Embodiment, further comprising the steps of:

accessing a second lyric portion from said first relative position within a second Distinct Lyric Block of said body of lyrics data;

displaying said second lyric portion;

creating a second adjusted version comprising notes of said corresponding portion newly positioned horizontally to align horizontally with syllables of words of said second lyric portion;

displaying said second adjusted version.

A Third Non-Limiting Example Embodiment of the present invention would be a lyric display method comprising the steps of:

loading a body of lyrics data from at least one file or stream comprising lyrics data of at least one music piece, where either or both of [said file or stream] and [said body of lyrics data] comprises symbols that each identify a Distinct Lyric Block of said body of lyrics data;

acquiring a sequence of performance comprising a list of symbols that each specify one of said symbols that each identify, where said symbols that each specify are in a predetermined order of planned performance;

advancing from one sequence step to a next sequence step within said sequence of performance;

ascertaining a specified symbol of said symbols that each identify as that symbol which is specified by the symbol at said next sequence step within said sequence of performance;

ascertaining an identified Distinct Lyric Block of said body of lyrics data as that Distinct Lyric Block which is identified by said specified symbol;

ascertaining a displayable portion of Distinct Lyric Block as either that which is a totality of said identified Distinct Lyric Block or else one of a plurality of consecutively displayed portions of said identified Distinct Lyric Block, where said consecutively displayed portions are determined according to predetermined criteria for amount of material to simultaneously display;

displaying said displayable portion of Distinct Lyric Block.

A Fourth Non-Limiting Example Embodiment of the present invention would be the method of said Third Non-Limiting Example Embodiment, where said predetermined order of planned performance differs from the order in which said symbols that each identify appear either within said body of lyrics data or within said file or stream.

A Fifth Non-Limiting Example Embodiment of the present invention would be the method of said Third Non-Limiting Example Embodiment, further comprising the steps of:

accessing a first lyric portion from a first relative position within a first Distinct Lyric Block of said body of lyrics data, where said first relative position is a position of said first lyric portion relative to a start of said first Distinct Lyric Block;

displaying said first lyric portion;

accessing a corresponding portion of music notation data appropriate to said first lyric portion;

creating a first adjusted version comprising notes of said corresponding portion newly positioned horizontally to align horizontally with syllables of words of said first lyric portion;

displaying said first adjusted version.

accessing a second lyric portion from said first relative position within a second Distinct Lyric Block of said body of lyrics data;

displaying said second lyric portion;

creating a second adjusted version comprising notes of said corresponding portion newly positioned horizontally to align horizontally with syllables of words of said second lyric portion;

displaying said second adjusted version.

A Sixth Non-Limiting Example Embodiment of the present invention would be the method of said Fifth Non-Limiting Example Embodiment, where said predetermined order of planned performance differs from the order in which said symbols that each identify appear either within said body of lyrics data or within said file or stream.

A Seventh Non-Limiting Example Embodiment of the present invention would be a licensed audio playback method comprising the following steps:

accessing a media file or stream comprising audio data and one or more product identifying codes, where each of said one or more product identifying codes specifies or corresponds to at least one product comprising said audio data;

accessing a certain product identifying code of said one or more product identifying codes, where said certain product identifying code specifies or corresponds to a certain license condition indication of one or more preexisting license condition indications;

making the decision of whether or not to play said audio data (or portion thereof), where said decision is based upon said certain license condition indication, the present date or a combination of both.

An Eighth Non-Limiting Example Embodiment of the present invention would be the method of said Seventh Non-Limiting Example Embodiment, where:

said media file or stream also comprises one or more trial condition indicators, where a certain trial condition indicator of said one or more trial condition indicators specifies a preexisting rule or algorithm that determines how said decision shall be made with respect to said certain license condition indication, the present date or a combination of both.

A Ninth Non-Limiting Example Embodiment of the present invention would be the method of said Eighth Non-Limiting Example Embodiment, where:

said preexisting rule or algorithm specifies a number of days (or playing times or program loadings) since the first day of access to said media file or stream during which said decision shall be to play said audio data (or portion thereof).

A Tenth Non-Limiting Example Embodiment of the present invention would be the method of said Eighth Non-Limiting Example Embodiment, where:

said preexisting rule or algorithm specifies a range of calendar days during which said decision shall be to play said audio data (or portion thereof).

An Eleventh Non-Limiting Example Embodiment of the present invention would be the method of said Eighth Non-Limiting Example Embodiment, where:

where a first trial condition indicator of said one or more trial condition indicators specifies a first preexisting rule or algorithm that determines how a first instance of said decision shall be made with respect to said certain license condition indication, the present date or a combination of both, and where a second trial condition indicator of said one or more trial condition indicators specifies a second preexisting rule or algorithm that determines how a second instance of said decision shall be made with respect to said certain license condition indication, the present date or a combination of both, and where said audio data shall be played if a Boolean result of a predetermined algorithm for combining said first instance and said second instance is true.

A Twelfth Non-Limiting Example Embodiment of the present invention would be the method of said First Non-Limiting Example Embodiment, where:

the number of said notes within said corresponding portion differs from the number of said syllables of words of said first lyric portion.

A Thirteenth Non-Limiting Example Embodiment of the present invention would be the method of said Second Non-Limiting Example Embodiment, where:

the number of said notes within said corresponding portion differs from the number of said syllables of words of said first lyric portion or the number of said syllables of words of said second lyric portion.

A Fourteenth Non-Limiting Example Embodiment of the present invention would be the method of said Fifth Non-Limiting Example Embodiment, where:

the number of said notes within said corresponding portion differs from the number of said syllables of words of said first lyric portion or the number of said syllables of words of said second lyric portion.

A Fifteenth Non-Limiting Example Embodiment of the present invention would be the method of said Sixth Non-Limiting Example Embodiment, where:

the number of said notes within said corresponding portion differs from the number of said syllables of words of said first lyric portion or the number of said syllables of words of said second lyric portion.

While the first Fifteen Non-Limiting Example Embodiments of the present invention satisfy the 35 USC 112 requirement that the specification shall set forth the best mode contemplated by the inventor (for their relevant aspects of the present invention), a Sixteenth Non-Limiting Example Embodiment of the present invention described below fulfils (for its relevant aspects of the present invention) the 35 USC 112 "enabling written description" requirement.

As the requirement is to enable any person skilled in the art to which it pertains, the enabling description below is intended only for one skilled in the arts to which it pertains, rather than one skilled in other, less relevant arts. Therefore, knowledgeable understanding of methods and tools well known in the relevant arts of music notation and graphic computer programming will be required of the reader. Although the present invention could be preformed in other platforms, for the sake of disclosures herein the reader is expected to be skilled in graphic programming areas of GDI, GDIplus and DirectX. Furthermore, the reader will particularly need to know Visual Basic in order to understand certain examples.

Just as a carpenter instructed to "drive a nail" must know to "grab a hammer", a programmer instructed to perform a well known operation such as "copy a rectangular region" must know to use the appropriate well known method within graphic programming such as (but not limited to) the BitBlt function of GDI under the Windows API. The most relevant arts of the present invention are music notation and graphic computer programming. A sound knowledge of both fields is required of any individual who shall be considered skilled in the relevant arts.

A graphic programmer expert in music notation who is instructed to perform any well-known operation must know to use (and know how to use) said operation's appropriate well-known method within graphic programming and or music notation. In short, this patent requires one skilled in the relevant arts, not one "partially skilled" or "almost skilled" in the relevant arts. As the patent office is already busy enough without having to read thousand page specifications, it should be appreciated that for the sake of brevity this patent specification shall not attempt to provide an education in the relevant arts to which the present invention pertains.

In view of this considerate policy, the examiner is respectfully requested to acknowledge the fact that one skilled in the arts does not need detailed recital of the steps of well known methods in each trade, but instead merely requires for each disclosed purposeful step a designation of which well known methods are used, what their inputs are and what their outputs are. It is hoped that the examiner appreciates that this approach is just as enabling for those skilled in the arts, while possibly saving years of examiner time and trees worth of paper.

Please note that several aspects (such as code examples) of the next example embodiment are simplified for the sake of clarity. It should be understood that the actual scope of the present invention is as broad as the first Fifteen Non-Limiting Example Embodiments and the claims themselves. For instance, although the shown code copes with verse 1 and verse 2, the full scope of present invention should be able to cope with any possible Distinct Portion. Furthermore, the operating systems could be other than Windows, the graphic environments could be other than GDI, GDIplus and DirectX, the language could be other than Visual Basic, and the code methods could be very different and still do the same things (or many things as wide in scope as the claims).

At the risk of belaboring the obvious, most of what is below comprises operations and approaches well known in the art to tasks already taught in the parent patent. Most of the length of explanation below accounts for such review of what those skilled in the arts should already have been able to "hammer together" based upon the parent patent specification. Nonetheless, there are a few choice aspects that should be recognized as surprisingly new. Those are the aspects of new material that pertain to what should be the unexpected aspects of the new claims. While many of the claims of this CIP reclaim the broadness intended for the original specification as filed, this CIP does also include those few radically new concepts mentioned above.

A Sixteenth Non-Limiting Example Embodiment of the present invention is as a music and lyric display method described as follows.

A body of lyrics data is loaded from a text file containing lyrics. This text file comprises many lines delimited by the standard vbCrLf Carriage Return (Ascii 13, &H0D then Ascii 10, &H0A). Therefore it can be loaded into a collection of lines by a group of operations within Visual Basic (VB) such as:

```
'*************** Start of Example Code Segment ****************
Dim LyricBodyCollection as new collection, LineIn as string, LineIndex
as string
Do Until LyricBodyCollection.Count < 1
   LyricBodyCollection.Remove 1
```

-continued

```
Loop
If dir(mFullPathNameOfLyricFile) <> "" then
   Open mFullPathNameOfLyricFile for input as #1
      If not eof(1) then
         Do until eof(1)
            Line Input #1, LineIn
            Gosub MakeIndex
            If LineIndex <> "" then
               LyricBodyCollection.add LineIn, LineIndex
            EndIf
         Loop
      EndIf
   Close 1
EndIf
'Now LyricBodyCollection contains all non-blank lines of our body of
lyrics data
'************** End of Example Code Segment ***************
```

The example code above includes two entries that will be later explained:

"Gosub MakeIndex" and "LineIndex". The first entry is a call to a section of code within the same Sub (called "MakeIndex") that generates an index for the lyrics collection (called "LineIndex"). It will be shown and explained below.

Our body of lyrics data comprises symbols that each identify a Distinct Lyric Block of said body of lyrics data. As mentioned above, a Distinct Lyric Block can be a verse, chorus or other things. For the sake of this particular example we will focus on verses. It should be understood that the present invention allows for any kind of Distinct Lyric Block, not just verses or choruses.

In this example, said symbols that each identify are the following symbols: "V1" and "V2". The first line of the first verse begins with "V1." (without the quotes) and the first line of the second verse begins with "V2." (without the quotes). Thus "V1." And "V2." Indicate the start of verse one and verse two, respectively. In this example, also, there is a pre-existing rule we have established that only one line of lyrics shall be displayed at a time (simultaneously). That means that in order to successfully display a certain verse, we will need to display each line of that verse in order until every line of the verse has been displayed.

Now, in order to prepare for the display of consecutive lines within each verse, the following section is provided, which is called by the code above.

```
'************************ Start of Example Code Segment ************************
MakeIndex:
   LineIn=trim(LineIn)
   If LineIn=" " then
   LineIndex=" "
   Else
   Select Case lcase(left(LineIn, 3))
      Case "v1."
         'Strip the symbol from the front of the line to display
         LineIn=right(LineIn, len(LineIn)-3)
         LineCount=1
         IsBlock="v1."
      Case "v2."
         'Strip the symbol from the front of the line to display
         LineIn=right(LineIn, len(LineIn)-3)
         LineCount=1
         IsBlock="v2."
      Case Else
         LineCount=LineCount+1
   End Select
   LineIndex=IsBlock & trim(str(LineCount))
   EndIf
Return
'Now LineIndex indexes each line of our body of lyrics data collection at the time
'of each gosub, thus the LyricBodyCollection collection is string indexed thereby
'************************ End of Example Code Segment ************************
```

Of course, adding more Cases (and more case statements for longer symbols) should accommodate any number of possible Distinct Lyric Blocks, since the true scope of the present invention is broad regarding possible Distinct Lyric Blocks.

Next we are acquiring a sequence of performance comprising a list of symbols that each specify one of said symbols that each identify, where said symbols that each specify are in a predetermined order of planned performance. In this particular example case, the sequence consists of only two symbols, and is written as so: "V2. V1." and because the first symbol shown is "V2.", the first lyric block that shall be performed is the second verse of this song, because the "V2." symbol within the sequence specifies the similar symbol "v2." in the body of lyrics, which identifies the second verse of our body of lyrics. As we have already loaded our collection with the lines of our lyrics file whose full path name is held within the variable called mFullPathNameOfLyricFile, we can now acquire and run the sequence.

First we need to acquire the sequence. To do so, we can create another collection. Here is some code that will pack a sequence collection from the example sequence I've specified. In this example I'll load the sequence from a file, after first writing the file, so you can see what the file has in it.

```
'************************ Start of Example Code Segment ************************
'First we pre-pack the sequence file so you know what it holds
Open mFullPathNameOfSequenceFile for output as #2
   Print #2, "V2.V1."
Close 2
'Now we acquire the sequence from a file, for this example
Open mFullPathNameOfSequenceFile for input as #1
   Line Input #1, LineIn
Close 1
WasLocPeriod=1
Do
   LocPeriod=instr(WasLocPeriod, LineIn, ".")
   If LocPeriod=0 then exit do
   Lenitem=(LocPeriod+1)-WasLocPeriod
   SequenceCollection.add mid(LineIn, WasLocPeriod, LenItem)
   WasLocPeriod=LocPeriod+1
Loop
'Now SequenceCollection holds our sequence, one symbol at a time.
'************************ End of Example Code Segment ************************
```

Now we will be advancing from one sequence step to a next sequence step within said sequence of performance. To advance from one sequence step to a next sequence step when we have not done any steps yet means we are to advance from "none" step to first sequence step. So let's do that. If you run the code segment below a bunch of times, it will show line after line until every line of both verses indicated by the sequence have been displayed. Of course you would keep advancing the display until every sequence step has been fully shown. In this example, remember, we have predetermined that only one line will be displayed at a time. Therefore, whoever runs this sequence will have to keep running the code I show below enough times until every line of both verses has been displayed. A step of "waiting for a user input"

could be implied by the necessity of running the code numerous times to display the entire sequence. But such an implied step, being "an extra step", does not add to or detract from the fact that every feature of the claims is shown within the specification.

The code shown further below advances to the next sequence step. In doing so it will be ascertaining a specified symbol in said body of lyrics data as that symbol which is specified by the symbol at said next sequence step within said sequence of performance; and it will be ascertaining an identified Distinct Lyric Block of said body of lyrics data as that Distinct Lyric Block which is identified by said specified symbol; and it will be ascertaining a displayable portion of Distinct Lyric Block as one of a plurality of consecutively displayed portions of said identified Distinct Lyric Block, where said consecutively displayed portions are determined according to predetermined criteria for amount of material to simultaneously display; and we had already said that the predetermined criteria shall be that we will display only one line at a time.

It should also be noticed that since the sequence starts with verse 2 then does verse 1, the predetermined order of planned performance differs from the order in which said symbols that each identify appear within said body of lyrics data. In the example below, we will assume, for now that whenever you call the sub DisplayPortion it will display whatever is the text contents of the string variable called LyricsLine. Thus upon such call it will be displaying said displayable portion of Distinct Lyric Block. Here below is the example code for doing what is described above.

Within the code immediately below I will simply show the sub DisplayPortion(LyricsLine, ThisBlock, IndexInBlock) call, but more further below I will show what the DisplayPortion sub would entail.

```
'************************ Start of Example Code Segment ************************
'Perform this following code each time you want to display a line, until every
'line of every Distinct Lyric Block specified in the sequence has been displayed
Static SequenceIndex as long, ThisBlock as string, IndexInBlock as long
Dim LyricsLine as string
IndexInBlock=IndexInBlock+1
LyricsLine=" "
LyricsLine=LyricBodyCollection (ThisBlock & trim(str(IndexInBlock)))
Err.clear
If LyricsLine=" " then
   SequenceIndex=SequenceIndex+1
   If SequenceIndex>SequenceCollection.count then exit sub
   IndexInBlock=1
   ThisBlock=SequenceCollection(SequenceIndex)
   LyricsLine=" "
   LyricsLine=LyricBodyCollection (ThisBlock & trim(str(IndexInBlock)))
   If LyricsLine=" " then exit sub
EndIf
DisplayPortion(LyricsLine, ThisBlock, IndexInBlock)
'Now the displayable portion has been displayed
'************************ End of Example Code Segment ************************
```

If you perform the above code enough times, it will display every line of verse 2 then verse 1, since the sequence already loaded by prior shown code was "V2.V1".

Next we will do something very special; we will display the sheet music for the line being shown. As we keep performing the code above, the lines of the verse are displayed. Therefore in the code above, we have actually been accessing a first lyric portion from a first relative position within a first Distinct Lyric Block of said body of lyrics data, where said first relative position is a position of said first lyric portion relative to a start of said first Distinct Lyric Block; and then by means of the DisplayPortion(LyricsLine, ThisBlock, IndexInBlock) call we have been displaying said first lyric portion.

Because of the way that the DisplayPortion routine below also displays the sheet music pertaining to the line being displayed, we are also accessing a corresponding portion of music notation data appropriate to said first lyric portion; and we are creating a first adjusted version comprising notes of said corresponding portion newly positioned horizontally to align horizontally with syllables of words of said first lyric portion; and we are displaying said first adjusted version. Then, as we keep repeating the code above, we will end up showing the same line of both verses.

When the same line of the next verse is displayed, we are accessing a second lyric portion from said first relative position within a second Distinct Lyric Block of said body of lyrics data; and we are displaying said second lyric portion; and we are creating a second adjusted version comprising notes of said corresponding portion newly positioned horizontally to align horizontally with syllables of words of said second lyric portion; and we are displaying said second adjusted version.

This particular embodiment comprises sheet music (music notation) display as well as the display of the text of the line of verse being shown. That is why the call also specified the additional variables that let the program know which line of which distinct portion of music notation data to use in the display. Therefore the call was for DisplayPortion(LyricsLine, ThisBlock, IndexInBlock) and not just for DisplayPortion(LyricsLine).

But before we do that, we will first disclose how to set up and how to populate the necessary musical data object model that is used by this example for the graphical display of the music notation appropriate to the line of lyrics being so displayed. Here below is that disclosure of packing the musical object model. After the disclosure on packing the musical object model, we will finally disclose the graphics display routine DisplayPortion(LyricsLine, ThisBlock, IndexInBlock) and its requisite code. (But first, the packing of the object model.)

The parent spec disclosed loading a lyrics file into a syllables collection. As the syllables collection was said to contain punctuation that tells the program which adjacent syllables go together into each big word, it was obvious that such punctuation either existed within the lyric file or could be derived according to a dictionary in memory (the latter was specified by the provisional patent that was incorporated by reference).

The parent spec did not have to cope with cases where the number of syllables differs from the number of notes. This is known because it said that for each displayed line the count of the syllables collection was equal to the count of the notes collection. This one to one correlation made it easy for one skilled in the art to implement the claims in their simplicity. (The claims were especially simple in that there was no requirement stated for the lyric portions of claim 28 to be the same lyrics of claim 29.) But this being a CIP we are going to do something not just new, but truly twisted and radically new.

Not only will there now be claims to show them as being the same lyrics, but we are also going to provide for a case where the number of notes in a line does not match the number of syllables. To make this new thing happen, the following code example shall expect the following properties of a lyric line:

1. The syllables of words in a lyric line are delimited (separated) by a dash.
2. Spaces shall only be used to separate whole words from each other. Therefore, the last syllable of each word shall be delimited by a space, rather than a dash.
3. Whenever two or more syllables of words are intended to share the duration of one midi note, they are called "sharing syllables". Sharing syllables consecutive within the same word shall not be separated by any symbol at all. Neighboring sharing syllables who are the last syllable of a previous word and the first syllable of a next word shall be delimited by an underscore, rather than by a space. Thus if a midi note is held across the boundary of one word and the next, an underscore rather than a space shall separate those two words, at least within the lyrics file. When that happens, the underscore will be replaced by a space as the two syllables are put into a single syllable's slot in the syllables collection for the line to be displayed, thus causing the visual text display of those two words to be separated by a space rather than underscore. Even with the space in it, that single entry in the syllables collection will be treated by the mechanics of display as being one single syllable.
4. Whenever one syllable is intended to be spread across two or more notes, said syllable shall be delimited by a number of dashes equal to the number of notes intended for that syllable, but the last of such dashes shall instead be a space if that syllable held across two or more midi notes happens to be the last syllable of a word.

The following example code segment shows how to load that LyricsLine into the syllables collection for the display of that one line. This code shown below has a routine called LoadSyllablesCollection, which gets run by code further below. After you see how this routine works, you will understand what it does when it is called by another example code segment further below.

```
'************************ Start of Example Code Segment ************************
Private Sub LoadSyllablesCollection(LyricsLine as string)
LyricsLine=Trim(LyricsLine) & " "
'Empty the SyllablesCollection
Do until SyllablesCollection.Count<1
  SyllablesCollection.Remove 1
Loop
  'Now fill it properly
pLineLen=len(LyricsLine)
For pForChar=1 to pLineLen
  pChar=mid(LyricsLine, pForChar)
  Select Case pChar
  Case " ", "-"
    pIsPunc=True
  Case Else
    If IsPunc then
      'The last char was - or space, so it is a new syllable
      pIsDelim=True
    Else
      pIsDelim=False
    EndIf
    pIsPunc=False
  End Select
  If pIsDelim then
    SyllablesCollection.Add pThisSyll
    pThisSyll=" "
    EndIf
    pThisSyll=pThisSyll & pChar
    pWasPunc=pIsPunc
Next
'Add the last syllable to the collection
SyllablesCollection.Add pThisSyll
'Now the syllables collection is full for this particular line to display.
'************************ End of Example Code Segment ************************
```

Now the syllables collection for this line has been built from this displayable line of lyrics data. We will also need to make access to the musical information to be displayed. The musical information will be contained within an object model that allows us to grab the appropriate music notation data required for each syllable of displayable text. To show how we use that, we first need to show what it is. We will now rewind our lesson just a little bit and show you what that musical object model is, and how it gets packed. Once the musical information object model is packed, we can start to perform the line-by-line musical display that we have been describing. The only reason we have waited this long to show packing the musical object model is that it was important to show the flow of the lyrics interpretation and display. Now we will discuss that musical object model.

One preferred embodiment method disclosed in the provisional patent (which was incorporated by reference in the parent patent) comprises loading a midi file that has had a track added to it containing a note for each syllable, and also containing symbolic lyrics data that, rather than containing actual lyrics, instead contains formatting information to indicate the presence of each syllable, the identity and number of the present verse, chorus or other such structure, as well as the line number within such structure. In addition to the symbolic lyrics there are also some midi events that specify the values of a structure called the LatestMidiParameters. This structure is created within the Declarations section as such:

```
'************************ Start of Example Code Segment ************************
'***** In Declarations section: *****
Private Type LatestMidiParameters
  TimeSignature as long
  KeySignature as long
  TickInMeasureLineBegins as long
End Type
Private mLatestMidiParameters as LatestMidiParameters
'************************ End of Example Code Segment ************************
```

The first two values within this structure are specified by default as the Key of C and the Key Signature of 4/4 unless otherwise specified. As the midi file gets read in, any time a key signature is encountered, it is translated into a long value that stands for the key signature, and mLatestMidiParameters.KeySignature is set to that value. Also as the midi file gets read in, any time a time signature is encountered, it is translated into a long value that stands for the time signature, and mLatestMidiParameters.TimeSignature is set to that value. The third element in this structure is actually calculated on the fly from other information on hand, and held as-is within the structure until the next such calculation is made. This special midi input file is required to be made in such a way that time signature events can only occur at the beginning of a measure.

Because of that requirement, it simplifies the calculation of the beginning of each line. Whenever a key signature event is received as the midi file is read in, mLastTimeSigTick (as long) value is set to the tick count address of the spot in the midi file where that time signature event was received. New lines are detected by means of the symbolic lyrics information as shown below. Thus, when the new line is detected, mLatestMidiParameters.TickInMeasureLineBegins is calculated, as you will see in the code below. It is calculated by taking the moment (tick) of the last encountered time signature (the start of the midi file being zero), subtracting it from the moment that the first chord of the line begins; yielding the number of ticks the present chord is at, since the latest time signature first began. Then this value is "modded" (Mod function) by the time signature (as long), which shows the number of ticks per measure. This operation ends up throwing away all whole measures past and gives just the fractional portion of a measure where the first chord of the present line is found, timing wise. This information will be crucial in knowing where to place the first measure marking on each line of displayed music notation data. This ready knowledge makes it convenient to display a partial measure at the beginning of each line, any time a "pick-up" note (or a number of them) begins a displayed line of words.

Each note-on of the syllables track has symbolic lyrics. The symbolic lyrics of each such note-on therefore tells:

1. Whether a syllable is present for that note (or whether that note is simply a continuation of a previously held syllable)
2. The identity and number of the present verse, chorus or other such structure
3. The line number within such structure These symbolic lyrics are not the same lyrics of the syllables collection or the lyric line. These symbolic lyrics are really just some cryptic information that occupies the position that lyrics would normally have within the midi file, according to the midi standard. Each of these symbolic lyrics gives some important information about each note of midi data, within our special input format midi file.

Our symbolic lyrics have a particular format as specified above. An example standard for the symbolic lyrics that communicate the above facts for each note (or chord) within the special midi file could be anything else that would work, but it could also be as follows:

S0 or S1 (where 0 or 1 is false or true for whether a syllable is present)

immediately followed (with no spaces) by:

DV1 (where V1 is an example symbol for what Distinct Lyric Block it is in)

immediately followed (with no spaces) by:

L1 (where 1 is an example for what is line number within Distinct Lyric Block)

Thus an example symbolic lyric for a note could be S0DV1L1, which would indicate that the note does NOT correspond to a syllable present, but instead is one of two or more notes played while holding the same syllable (an example of such cases would be all the notes for the held syllable "Glo---" within the "Gloria" chorus of the Christmas Carol "Angels we have heard on high"). In this way we have a symbolic lyric embedded within the midi file (according to the published midi standard as pertaining to lyrics) for each of the notes (or chords, being stacks of simultaneous notes) in the midi file. (In this case it would also be just as feasible to count every note as a syllable, and then to add the appropriate number of dashes to the Glo--- syllable within the (real) lyrics file instead. But by doing it the way shown above this parenthetical comment, the Gloria word in the (real) lyrics file can be represented by the much more simple "Glo-ri-a", making the (real) lyrics file much easier to read.)

And this symbolic lyric per note specifies the information required to display the notes of the midi file as sheet music correlated to the appropriate syllables obtained from the syllables collection when each displayable portion (in this instance, each line) is to be displayed. (In such case as above, the letters S, D and L would be reserved characters, which would stand for SyllablePresent, DistinctLyricBlock and LineInBlock, respectively.) When midi-on events are reached, the inputting code processes such special midi file into the object model shown below. And of course, when the midi note-off event is reached, the note is understood to have ended, and required note-end processes are also performed and the object model below is updated, as shown below.

The number shown in the second information ("DV1") above is not needed if the sheet music (midi data) for all the verses and all the choruses is the same. The midi file can simply have one chorus and one verse, which will be recycled for all verses and all instances of playing the chorus. But if the sheet music (midi data) is different for different verses or choruses, the midi file can contain each different version, which can be used to prepare a sheet music display of the song exactly as it is with the variations in music notation. It should be understood, however, that most uses would have a midi file with only one version of the verse and chorus. In such case a likely symbol would be "DV" rather than "DV1". For example, in this example below we will assume that the midi file contains only one version of a verse, thus it can be recycled for all verses. After all, our present example only seeks to display verse 2 then verse 1.

Based upon the LatestMidiParameters and these three pieces of information, for each midi note (and for timing purposes a midi chord is to be considered like a single midi note although all its notes would be displayed on screen), we can assemble an object model for sheet music that has the following properties (in semi-outline format):

A. DistinctBlocks as Collection
    DistinctBlock as Structure (Type) below:
    1. BlockSymbol as string (as in V, C, C2, etc. . . . )
    2. Lines as Collection
        Line as Structure (Type) below:
        a. Line Number as Long (as in 1, 2, 3, 4)
        b. Chords as collection filled with each chord
            Chord as structure (Type) below:
                TickStarted as long (miditick=quarter note/48)
                TickEnded as long (miditick=quarter note/48)
                SyllablePresent as Boolean
                NotePitches as collection (of longs)
                TimeSignature (as long)
                KeySignature (as long)
                TickInMeasureLineBegins (as long)

Thus musical information is loaded from midi file into a structure created within the declarations section of Visual Basic (VB) code like this:

```
'************************ Start of Example Code Segment ************************
'***** In Declarations section: *****
Private mLastTimeSigTick as long
Private Type Chord
    TickStarted as Long '(This is Tick when the chord starts)
    TickEnded as Long '(This is Tick when first ending note of chord ends)
    SyllablePresent as Boolean '(Tells if note is continued or new syllable)
    NotePitches as New Collection
    'Individual midi Note Pitches (as long) for notes in a chord
    'started at the same moment are added to this collection
    TimeSignature as Long
```

```
    KeySignature as Long
    TickInMeasureLineBegins as long
End Type
Private Type Line
    LineNumber as Long '(This is which line number within DistinctBlock)
    Chords as New Collection '(each Chord is added to this collection)
End Type
Private Type DistinctBlock
    BlockSymbol as string '(as in V, C, C2, etc. . . . )
    Lines as New Collection '(each Line is added to this collection)
End Type
Private DistinctBlocks as New Collection
    '(each DistinctBlock is added to this collection)
Private ThisChord as Chord '(This is the present one being packed from midi)
Private ThisDistinctBlock as DistinctBlock '(This is present one being packed)
'*********************** End of Example Code Segment ***********************
```

As we read in the special midi file, we maintain a few temporary structures (Types). These are: ThisChord (as Chord), ThisLine (as Line) and ThisDistinctBlock (as DistinctBlock). Finally, the permanent (not temporary) DistinctBlocks (as collection) is built up. As we read through the midi file we pack each temporary smaller ("twig") object, then when that smaller "(twig") object is complete, we add it to the larger ("branch") object and clear out the temporary smaller ("twig") object so we can re-use it again. Thus the smaller objects within the object model get packed into the larger objects from the data being read in, until the entire hierarchical object model is fully populated from the information provided by the special input format midi data.

When our special input format midi file is read and parsed, its data is stored into the structures (types) made above. As each midi chord is read in, we populate the input variables: MidiChordPitches (as collection of longs), MidiChordSyllablePresent (as Boolean), MidiDistinctLyricBlock (as string) and MidiLineInBlock (as long). These input variables represent all the information we can get from the midi data pertaining to the moment when the chord begins. The moments where each of the midi notes in the chords ends may or may not show a bunch of "stragglers" that end at different times. If one midi pitch ends while the rest are held, the first ending midi pitch of a chord shall mark the end of that chord.

Whenever any note ends, it can end the chord it is in only if the present chord is the same chord that its beginning started. In other words, when a note-off is encountered, the pitch of the note off is compared to the pitches presently considered as on within the present chord's pitches collection. If the pitch is found therein, then and only then is that pitch note end allowed to end the chord. The policy separates each chord into a distinct entity that can thus be correlated with a syllable. Any note that ends after the chord has officially ended has no effect upon the chord, as that ending pitch is already ancient history anyway.

The midi data is read in such a way that midi ticks are considered in sequential order, and all midi data pertaining to such midi tick is considered at once. (A midi tick is the numerical value for the absolute time elapsed within the midi file, expressed a $48^{th}$ of a quarter note, or some other such predetermined standard). Thus a "tick" can be considered as an addressed moment within the midi file, which for this example code is expressed as a variable having type called "long".

Based upon this policy for reading the midi file, each moment ("tick") as read will provide either nothing useful (in which case nothing is done), a chord (whenever a midi-on is gotten) or the moment that ends the present chord (whenever a midi-off has a pitch that is found active within the note pitches collection of the present chord being built, as ThisChord.NotePitches).

Whenever a chord is gotten, the midi-tick time of its getting is known as MidiMomentTick (as long) and it is important. Whenever a chord is ended, its midi-tick ending time is known as MidiMomentTick (as long), and it is also important (thus when either meaningful event is processed, the midi-tick time address thereof is stored as MidiMomentTick). While reading the midi file, once a chord is gotten according to this policy, the StartChord( ) sub is performed; and once a chord is ended according to this policy, the EndChord( ) sub is performed.

Neither the StartChord sub nor EndChord sub has any passed arguments, but instead they have access to the global variables MidiMomentTick (as long), MidiChordPitches (as collection of longs), MidiChordSyllablePresent (as Boolean), MidiDistinctLyricBlock (as string) and MidiLineInBlock (as long), as well as the variables and collections within the temporary structures (Types): ThisChord (as Chord), ThisLine (as Line) and ThisDistinctBlock (as DistinctBlock), and last but not least, the permanent (not temporary) DistinctBlocks (as collection) that is being built up.

The above having been established, the following code fully populates the entire object model of the DistinctBlocks collection simply by responding to a reading through of the special input format midi file, where the StartChord( ) sub shown below is performed whenever (within said reading through) a chord starts and where the EndChord( ) sub shown below is performed whenever (within said reading through) a chord ends. Last but not least, our code has global variables for keeping track of changing hierarchical member assignments. These global variables are WasMidiDistinctLyricBlock (as string) and WasMidiLineInBlock (as long). Here is an example code responsible for this building up of the DistinctBlocks object model according to this teaching.

```
'*********************** Start of Example Code Segment ***********************
'This code packs the entire DistinctBlocks object model by means of the reading in of the midi data
'making as many calls as necessary to the StartChord( ) and
'EndChord( ) subs.
Private Sub StartChord( )
    'Jot down the starting tick for this chord
    ThisChord.TickStarted=MidiMomentTick
    'Set the syllable present boolean
    ThisChord.SyllablePresent=MidiSyllablePresent
    'Reset the chord ending
    ThisChord.TickEnded=0
    'Copy the MidiChordPitches collection (of longs)
    'to the ThisChord.NotePitches collection (of longs)
    For pFor=1 to MidiChordPitches.Count
    ThisChord.NotePitches.Add MidiChordPitches(pFor)
    Next
    'Now add the mLatestMidiParameters data
    ThisChord.TimeSignature=mLatestMidiParameters.TimeSignature
    ThisChord.KeySignature=mLatestMidiParameters.KeySignature
    ThisChord.TickInMeasureLineBegins=_
    mLatestMidiParameters.TickInMeasureLineBegins
End Sub
```

```
Private Sub EndChord( )
  If MidiLineInBlock< >WasMidiLineInBlock then
  'Save ThisLine to ThisDistinctBlock.Lines collection, keyed by old line#
  ThisDistinctBlock.Lines.add ThisLine, trim(str(ThisLine.LineNumber))
  'Reinitialize the temp ThisLine structure
  Do until ThisLine.Chords.Count<1
    ThisLine.Chords.Remove 1
  Loop
  'It shall be numbered according to MidiLineInBlock (long) variable
  ThisLine.LineNumber=MidiLineInBlock
  'Calculate mLatestMidiParameters.TickInMeasureLineBegins on the fly
  mLatestMidiParameters.TickInMeasureLineBegins=_
  (ThisChord.TickStarted-mLastTimeSigTick)_
  Mod mLatestMidiParameters.TimeSignature
  EndIf
  MidiDistinctLyricBlock=lcase(MidiDistinctLyricBlock)
  If MidiDistinctLyricBlock< >WasMidiDistinctLyricBlock then
  'Save ThisDistinctBlock to DistinctBlocks collection, keyed by old symbol
  DistinctBlocks.add ThisDistinctBlock, ThisDistinctBlock.BlockSymbol
  'Reinitialize the temp ThisDistinctBlock structure
  Do until ThisDistinctBlock.Lines.Count<1
    ThisDistinctBlock.Lines.Remove 1
  Loop
  'It shall be named according to MidiDistinctLyricBlock (string) variable
  ThisDistinctBlock.BlockSymbol=MidiDistinctLyricBlock
  EndIf
  'Jot down the ending tick for this chord
  ThisChord.TickEnded=MidiMomentTick
  'Add this completed Chord object to the Chords collection
  ThisLine.Chords.add ThisChord
  'Reset the ThisChord structure
  ThisChord.SyllablePresent=false
  ThisChord.TickStarted=0
  ThisChord.TickEnded=0
  Do until ThisChord.NotePitches.Count<1
  ThisChord.NotePitches.Remove 1
  Loop
  'Whatever the hierarchical members, save the Was of them
  WasMidiLineInBlock=MidiLineInBlock
  WasMidiDistinctLyricBlock=MidiDistinctLyricBlock
End Sub
'************************ End of Example Code Segment ************************
```

It should be understood that in this example, once the entire midi file has been fully read in to fully populate the whole DistinctBlocks object model (as disclosed above), the midi file need not be read again. In other words, the code and descriptions above have now set the stage to where I can start to display one line at a time, showing both the notes of sheet music horizontally aligned to fit the syllables of the displayed words of the "Displayable Portion" (line of lyrics).

The following routine displays one line of text with one line of sheet music. While this example is not monophonic (as it allows harmony), there will be only one stave, and one chord (of one or more notes) will be aligned to fit with one syllable, as controlled or mitigated by previously established holding or sharing criteria. The location of a note shall be one third of the way from the start of a syllable to the end of said same syllable. Other spacing rules could be used, but this is considered to be pleasing to the eye and is thus used in this example.

If two or more chords (of one note or more) are given to one syllable, the notes shall be crammed in as best as can be within the space provided, but there shall at least be a space between the notes equal to three note-stick-widths, which will allow a clearly visible gap between. If the number of notes in a row thus exceeds the horizontal length of a syllable, then and only then will a dash be used to extend the length of the syllable. The extra space used by all the notes will be filled by two spaces (between that syllable and the next), with as many dashes in a row (without spaces between) as can be fit into the extra space.

If two syllables share the same note, the syllables will already be concatenated together with no spaces between, and will thus be seen by the software as a single syllable. In the process of displaying syllables, nonconsecutive dashes will be stripped off and underscores will be replaced with spaces before spacing measurements are made, but only after the syllables have been entered into the syllables collection. Thus a last syllable of a previous word and a first syllable of a next word would have a space between them, as they are one element within a syllables collection. The syllables collection is cleared and refilled from each lyric line to be displayed before graphic operations begin, even before textwidth measurements are made.

Having already shown how the syllables collection is filled, we can move on to describe the actual display. The method of display is described below. We will do this by showing the sequence of calling subs and functions that accomplish the fundamental operations necessary to do so. Below each such call I will provide a comment that describes what is basically being done, and what tools of programming are utilized to accomplish it. This approach is necessary, because although up to now the code has been small enough to show, the actual lines of code necessary to demonstrate each well-known operation in the graphic programming arts would take up enormous amounts of space within this patent.

Graphic programming techniques are well known in the art, and those who know such techniques also know all too well that the actual code listings for performing such well-known techniques are extremely long. Therefore, the calls to code modules employing standard techniques will be shown, and comments provided directly below such calls will identify which standard techniques those code modules employ.

Here at long last is the example code responsible for displaying the line of lyrics along with the music notation, where the notes of the music notation are aligned horizontally to fit the syllables of words of the lyric line.

```
'************************ Start of Example Code Segment ************************
Private Sub DisplayPortion(LyricsLine as string, ThisBlock as string, IndexInBlock as long)
  'ThisBlock = lcase(ThisBlock)
  'First, before showing each note, prepare the stave line for display
  ClearDisplay( )
  'This erases by using GDI BitBlt to fill the entire DC area with the color white.
  DrawStave( )
```

-continued

```
'This call draws the stave as five horizontal parallel lines. Like all drawing of
'lines in GDI that this example embodiment performs, this drawing lines uses
'CreatePen, MoveToEx and LineTo. The positional arguments used inside
'this sub make sure that the staff is drawn across the whole top middle of
'the display region in the Device Context used for preparing the display. The
'placement and spacing of this stave is absolute (the same each time).
'This will correlate with absolute vertical placements of copied note symbols.
'The thick bar portion of the alto clef of FIG. 5 is copied to the left edge of
'the drawn stave, such that its top is flush with the top line of the stave and its
'bottom is flush with the bottom of the stave. The placement is absolute (same
'every time a line's worth of music notation is drawn). Unless otherwise
'specified, the BitBlt function is used to do ALL copying from the FIG. 5
'template.
DrawCleff( )
'This copies the treble clef symbol from the FIG. 5 template onto the left
'most portion of the stave. The placement is absolute.
DrawKeySig(mLatestMidiParameters.KeySignature)
'This copies either nothing, an array or one or more sharps or an array of one
'or more flats, where the decisions of sharps or flats and how many is based
'upon the mLatestMidiParameters.KeySignature argument provided to the
'DrawKeySig sub. It copies them from the FIG. 5 template, (such that the
'centers of the sharps or the "bulbs" of the flats go) onto the correct locations
'of the stave. If flats, they are copied (as many as required to correctly depict
'the key signature to the middle line, then (over to the right by 1.5 note-width)
'to the top line, the to the line below the middle line and so on according to
'the well known and established rules for music notation regarding printing key
'signatures on the treble clef. If they are sharps, they are similarly copied first
'on the top line, then the second to top space, then the space above the top
'line and so on according to the well known and established rules for music
'notation regarding printing key signatures on the treble clef. (In this example
'time signatures are not drawn). Finally, the mNextAvailNoteLocation and
'mNextAvailSyllLocation (which are global long variables dimensioned in the
'declarations section) are set to the horizontal location half a note-width after
'the last sharp or flat of the key signature. This will be the starting location of
'the first word of the lyrics line. Now that the stave has been prepared, the
'printing of the lyrics line can now begin. This will be a process of printing
'each syllable, then each chord, the next syllable, then the next chord, and so
'on.
'
'Next we load up a temporary variable from the appropriate portion of the
'entire music notation object model.
Set ThisDistinctBlock = DistinctBlocks(ThisBlock)
Set ThisLine = ThisDistinctBlock.Lines(IndexInBlock)
pChordsThisLine = 0
'Now ThisLine contains the musical info for this lyric line
For pForSyllable = 1 to SyllablesCollection.Count
  pThisSyllable = SyllablesCollection(pForSyllable)
  pLocThisChar = len(pThisSyllable) + 1
  If right(pThisSyllable, 1) = " " then
    pThisSyllable = trim(pThisSyllable) & "-"
    pHasSpace = True
    'This makes the last space become a dash and a space
    'which makes the notes count come out right anyway
  Else
    pHasSpace = False
  EndIf
  Do
    pLocThisChar = pLocThisChar - 1
    if pLocThisChar < 1 then exit do
    pThisChar = mid(pThisSyllable, pLocThisChar)
    Select Case ThisChar
      Case " "
      Case "-"
        pNotesCount = pNotesCount + 1
      Case Else
        Exit Do
    End Select
  Loop
  For pForNotes = 1 to pNotesCount
    If pForNotes = 1 then
      pThisDisplayedSyllable = trim(replace(pThisSyllable, "-", ""))
    Else
      pThisDisplayedSyllable = "-"
    EndIf
    If pForNotes = pNotesCount then
      If pHasSpace then
        pThisDisplayedSyllable = pThisDisplayedSyllable & " "
      EndIf
    EndIf
    Gosub ProcessActiveSyllable
```

-continued

```
        'This will display the text of pThisDisplayedSyllable along with a note
      Next
   Next
Exit Sub
ProcessActiveSyllable:
   pChordsThisLine = pChordsThisLine + 1
   Set ThisChord = ThisLine.Chords(pChordsThisLine)
   pThisDisplayedSyllable = replace(pThisDisplayedSyllable, "_", " ")
   'Now we have pThisDisplayedSyllable and ThisChord
   'This code assumes that the chord ticks are done according to nice perfect
   'values like quarter notes, eighth notes and dotted quarters and such, rather
   'than by performance-derived approximate but not quite accurate values.
   'Therefore, any space between one chord and the next is first filled by a rest.
   'There is a 2 tick grace period for not bothering to show rests, just in case a
   'composer software package ends a midi note before beginning the next.
   ThisStartTick = ThisChord.TickStarted
   ThisEndTick = ThisChord.TickEnded
   'NOTE In this implementation SyllablePresent is always True anyway
   ThisTickInMeasureLineBegins = ThisChord.TickInMeasureLineBegins
   If pChordsThisLine = 1 then PreviousEndTick = ThisStartTick
   If ThisStartTick - PreviousEndTick > 2 then
      DisplayRest(ThisStartTick - PreviousEndTick, ThisChord)
      'This routine prints the rest defined by the sub's 1st argument (as long),
      'and places it at the horizontal location mNextAvailNoteLocation
      'It does it by selecting the appropriate rest symbol from the FIG. 5
      'template and copying it to the appropriate vertical location there.
      'All copy operations use tables to determine offset and length for
      'height and width from the FIG. 5 template image, and the BitBlt
      'routine is used to accomplish the actual copying to the target DC.
      'Based also upon the table for the kind of rest (or sequence of rests),
      'the mNextAvailNoteLocation is advanced according to the horizontal
      'length used up by the rests. The ThisChord structure is given as an
      'argument to the DisplayRest routine in case the rest lasts so long that a
      'measure boundary is encountered during it. This same care is given in
      'regard to the duration of chords, too. Whether a rest or a chord (notes),
      'the following operations are performed. First, the remaining ticks in the
      'measure is gotten by subtracting the present tick in the measure
      ' (mPresentTickInMeasure) from the number of ticks in each measure (time
      'signature). Then the intended length (in ticks) of the displayable object
      ' (whether rest or chord/notes) is compared to the remaining ticks in the
      'measure. If the measure ends before the displayable object does, then
      'the displayable object is cut into two pieces, where the first piece has a
      'value equal to the remaining ticks in the measure, and the second piece
      ' (which starts the next measure) has a value equal to the remainder of the
      'displayable object. The first piece is displayed, then the measure marker
      ' (which is a drawn vertical line from the bottom line of the stave to the top
      'line of the stave) is drawn, then the second piece; and if the object is a
      'note then ties are drawn between the first piece and the second piece,
      'where the ties are drawn as arcs of an ellipse using the GDI "Pie"
      'function.
   EndIf
   'mNextAvailNoteLocation is the next available spot after note is drawn
   'mNextAvailSyllLocation is the next available spot after syllable is drawn
   If mNextAvailNoteLocation > mNextAvailSyllLocation then
      mNextAvailSyllLocation = mNextAvailNoteLocation
   EndIf
   'Thus if any notes or rests take up too much space they will (reluctantly) push
   'out the next syllable to the right, but otherwise (normally) the notes will base
   'their horizontal location on that of the syllables.
   'Now the Syllable can be displayed, then the note can be displayed.
   'As this is a simplified example code, all notes will be displayed with flags,
   'rather than by means of beams, and all flags will go upward so as to avoid
   'the lyrics syllables printed below the stave.
   DisplaySyllable(pThisDisplayedSyllable)
   'This sub prints the Syllable using the GDI SetBkColor, SetTextColor and
   'TextOut functions. The TextWidth of the text is also measured using a
   'corresponding font and size as drawn, and the mNextAvailSyllLocation
   'variable is set ahead by that TextWidth. (You could also simply print the
   'text to a hidden VB text box and then BitBlt it to the target DC after
   'measuring the TextWidth, which would be even easier). If there is a very
   'tiny difference in measured syllable lengths they will not accumulate, as
   'the next printing will be at the prescribed location again; and they will not
   'really be noticed either, being so slight. In this example, the text syllables
   'are printed on a horizontal location below the stave, where you would
   'expect the lyrics to be for a soprano (or treble clef) part.
   'Finally, the notes shall be shown on the stave for this chord.
   DisplayChord(ThisEndTick - ThisStartTick, ThisChord)
   'This call is subject to the same instructions above (under the DisplayRest
   'call), as pertaining to splitting objects across the measure line, with ties as
   'needed for tying notes together across the measure line. The duration given
```

-continued

```
    'by the argument (as long) to this sub is used to look up the note body, flag
    'presence (as boolean), flag type and number of flags, as well as the stick
    'presence (as boolean). The note body shape, stick and flag shapes are
    'copied as required (from the FIG. 5 template) for the chord to be displayed,
    'and where the following conditions are fulfilled. The bottom of the stick (if
    'present) starts at the middle right of the note shape, and extends upward by
    'the length of the stick symbol copied (the thinner line in the FIG. 5 alto clef
    'symbol). The note bodies are placed preferably on the left, only on the right if
    'there is no room for them on the left without occupying the same vertical
    'space as lower (already) drawn note bodies. The width of note bodies and
    'flags (whichever is wider) is added to mNextAvailNoteLocation. (When note
    'bodies are used on the right of a stick, their horizontal width is added to
    'mNextAvailNoteLocation also). The flags are drawn only on the top of the
    'stick, as close together as possible yet reasonably legible. (The top flag is
    'drawn starting from flush with the top of the stick.) The vertical placement of
    'the note bodies is determined by a lookup table that has as one dimension
    'the key signature. If an accidental flat or sharp is indicated by the lookup
    'table (as indicated by one of two very high bits in the long value being set)
    'then the entire needed rectangular location (whose width is the width of the
    'needed accidental symbol) immediately prior to the intended location of the
    'note body is searched for any non-white pixels. If any non-white pixels are
    'found, then mNextAvailNoteLocation is (reluctantly) advanced by the width of
    'the needed accidental, and the note that has been built up so far is moved to
    'the right by that distance as well, then the note building continues, with the
    'needed accidental being copied to the appropriate rectangle to the left of its
    'corresponding note body. Now that the present syllable and chord have been
    'displayed, the whole process is allowed to repeat again until the entire lyrics
    'line and its notes have been displayed. (If the line of lyrics extends longer
    'than the DC allowed for display, the excess material to the right is left
    'truncated.)
  PreviousEndTick = ThisEndTick
Return
End Sub
'************************ End of Example Code Segment ************************
```

Thus the entire teaching for this Sixteenth Non-Limiting Example Embodiment of the present invention is complete. There remain just a few more Non-Limiting Example Embodiments left to teach. They are shorter.

A Seventeenth Non-Limiting Example Embodiment of the present invention is as a licensed audio playback method comprising the following steps:

accessing a media file or stream comprising audio data and one or more product identifying codes, where each of said one or more product identifying codes specifies or corresponds to at least one product comprising said audio data;

accessing a certain product identifying code of said one or more product identifying codes, where said certain product identifying code specifies or corresponds to a certain license condition indication of one or more preexisting license condition indications;

making the decision of whether or not to play said audio data (or portion thereof), where said decision is based upon said certain license condition indication, the present date or a combination of both.

An Eighteenth Non-Limiting Example Embodiment of the present invention would be the method of said Seventeenth Non-Limiting Example Embodiment, where:

said media file or stream also comprises one or more trial condition indicators, where a certain trial condition indicator of said one or more trial condition indicators specifies a preexisting rule or algorithm that determines how said decision shall be made with respect to said certain license condition indication, the present date or a combination of both.

A Nineteenth Non-Limiting Example Embodiment of the present invention would be the method of said Eighteenth Non-Limiting Example Embodiment, where:

said preexisting rule or algorithm specifies a number of days (or playing times or program loadings) since the first day of access to said media file or stream during which said decision shall be to play said audio data (or portion thereof).

A Twentieth Non-Limiting Example Embodiment of the present invention would be the method of said Eighteenth Non-Limiting Example Embodiment, where:

said preexisting rule or algorithm specifies a range of calendar days during which said decision shall be to play said audio data (or portion thereof).

A Twenty-first ($21^{st}$) Non-Limiting Example Embodiment of the present invention would be the method of said Eighteenth Non-Limiting Example Embodiment, where:

where a first trial condition indicator of said one or more trial condition indicators specifies a first preexisting rule or algorithm that determines how a first instance of said decision shall be made with respect to said certain license condition indication, the present date or a combination of both, and where a second trial condition indicator of said one or more trial condition indicators specifies a second preexisting rule or algorithm that determines how a second instance of said decision shall be made with respect to said certain license condition indication, the present date or a combination of both, and where said audio data shall be played if a Boolean result of a predetermined algorithm for combining said first instance and said second instance is true.

It should be understood that the present invention comprises various features that would best be included within a total solution for the purposes stated within the specification. Licensing is an important aspect of content management, as the parent patent has taught ways of delivering content. Therefore at the very least, the additional aspects of the present invention according to this CIP were inevitable for a total solution. It may well be that a total solution would also comprise other inventions or aspects of invention as well. Even so, because these present aspects pertain best to an overall solution comprising them it should be understood that they fall within the scope of a body that is herein called "the present invention".

Therefore, a Twenty-second ($22^{nd}$) Non-Limiting Example Embodiment of the present invention is as said Sixteenth Non-Limiting Example Embodiment, further comprising the steps of said Eighteenth Non-Limiting Example Embodiment.

A Twenty-third ($23^{rd}$) Non-Limiting Example Embodiment of the present invention is as a licensed audio playback method as described below.

A media file belongs to a certain media product. That media file comprises audio data, as well as a product identifying code and at least one trial condition indicator. Each trial condition indicator specifies one of several rules that govern whether or not to play such audio data, said rules being such as:

1. That the audio data should be allowed to play no matter what
2. That the audio data should be allowed to play for free only during a range of days each year, such as the whole month of December.
3. That the audio data should be played for free during the first 14 days since the audio data was first played.

The appropriate rule is selected based upon the value of the trial condition indicator. If the rule selected is rule number 3, the software first checks the windows registry (or some other repository) for an entry keyed by the product identifying code, which tells the software on what day the audio data was first played (if at all). If the audio data has not yet been played, a registry (or some other repository) entry is written (using the product identifying code as a key) and given a value specifying the present date as being the first date that the audio data has been played. If the registry (or other repository) shows that the audio data has already been played, the software subtracts the present date from its date of first playing specified in the registry (or other repository), and if the result of such subtraction is greater than 14 days, the software denies access to play said audio data.

If said result of such subtraction is within 14 days then the software allows access to play the audio data. The audio data is encrypted by means of PGP or some other algorithm, so that the audio data cannot be played by something other than the software according to the present invention. If there are two or more trial condition indicators, the audio data is allowed to play if the result obtained from any one of them would by itself allow the audio data to be played.

Furthermore, in this embodiment, regardless of the rules specified by any trial condition indicator, if a license condition indication within the registry or some other repository (using the product identifying code as a key) indicates that the audio data should be played, then the audio data is allowed to be played no matter what. If the user pays to license the audio data, then software writes a value of said license condition indication to indicate that the audio data should be allowed to be played no matter what.

While the above embodiment is given for the sake of clarification, it should be understood that the best mode scope of the relevant aspects of the present invention is as wide as the claims themselves, as indicated by listed previous embodiments. Based upon the material above, one skilled in the relevant arts should be able to demonstrate these aspects of the present invention. Nonetheless, for the sake of making it even easier for some to understand, follow or do so, the following is given.

A Twenty-fourth (24) Non-Limiting Example Embodiment of the present invention is as a licensed audio playback method as described below.

```
'************************* Start of Example Code Segment *************************
'This simplified code example still contains calls to subs that perform commonly known tasks in
' programming. For the sake of (already strained) brevity, many mundane details of such commonly
' known tasks will not be taught herein, as such are already quite well known in the art. Instead, the
' methods used by such called subs shall be identified; along with details of inputs and outputs
' necessary for understanding the usage of such called subs.
DecryptFile(FullPathMediaFile, MyPGPKey, MyStreamInMemory, Top64k)
'This uses PGP to decrypt a file off of the hard disc into a memory stream.
'The Full path is given so it knows exactly where to look for the file. The stream
'gets everything after the first 64k worth of data from the decrypted file. The first
'64k worth of decrypted data is copied into the string variable called Top64k. With that extra 64k
' shaved off from the beginning of the decrypted stream, the stream is now in proper format for a
' memory stream of unencrypted audio data. Next, the Top64k string will give us the trial condition
' indicators as well as the product identifying code.
ProductIdentifyingCode = trim(left(Top64k, 16))
LastTrialConditionIndicator = (instr(Top64k, "^^^^^^^^^^") - 17)
pLocIndicator = 17
For pForIndicator = 17 to LastTrialConditionIndicator step 4
   TrialConditionIndicatorsCollection.add clng(val(mid(Top64k, pForIndicator, 4)))
Next
' Now TrialConditionIndicatorsCollection contains a list of longs, one for each
' trial condition indicator value. If any member of this collection specifies a rule that ends up getting
' satisfied such that the audio data should be played then the audio data is played.
LicenseConditionIndication = WasPaidFromRegistry(ProductIdentifyingCode)
' This WasPaidFromRegistry looks up a paid-for status from the registry,
' defaulting to zero if not found, but if found to be equal to 1 then its been paid.
' (Remember this invention is for licensed playback, not for the process of
' activation; just like a CD disc is a related, different invention from a CD player.)
If LicenseConditionIndication = 1 then
   WhetherPlayAudio=True
Else
   WhetherPlayAudio=False
   For pForIndicator = 1 to TrialConditionIndicatorsCollection.count
      Select Case TrialConditionIndicatorsCollection(pForIndicator)
         Case 1 'This means that the audio should be played no matter what
            WhetherPlayAudio=True
            Exit For
```

-continued

```
        Case 2 'This means play the audio data if "now" is during December
            If Format(Now, "MM") = "11" then
                WhetherPlayAudio=True
                Exit For
            EndIf
        Case 3 'This means play audio if < 14 days since first playing
            NowLong = clng(now)
            FirstPlayLong = GetFirstPlayFromRegistry(ProductIdentifyingCode)
            ' This fetches the date of the first playing of this particular product
            ' from the registry, as keyed by the ProductIdentifyingCode.
            If FirstPlayLong = 0 then 'this is default if not found
                SetFirstPlayIntoRegistry(ProductIdentifyingCode, NowLong)
                ' This sets now as first playing date of this particular product
                ' into the registry, as keyed by the ProductIdentifyingCode.
                WhetherPlayAudio=True
                Exit For
            EndIf
            DaysPlayed = NowLong - FirstPlayLong
            If DaysPlayed < 14 then
                WhetherPlayAudio=True
                Exit For
            EndIf
    End Select
  Next
EndIf
If WhetherPlayAudio Then
  PlayStream(MyStreamInMemory)
  ' This sub plays the stream
Else
  DestroyStream(MyStreamInMemory)
  ' This sub clears the stream from memory
EndIf
'************************ End of Example Code Segment ************************
```

Other rules could be made and responded to. Also, other Boolean operations could be used for the combining of results from more than one rule. It should be understood that many variations of the above example processes could be made, even to the fullest extent of the scope of the claims, and still be within the intent of the present invention.

The invention claimed is:

1. A music and lyric display method comprising the steps of:

loading a body of lyrics data from at least one file or stream comprising lyrics data of at least one music piece;

accessing a first lyric portion from a first relative position within a first Distinct Lyric Block of said body of lyrics data, where said first relative position is a position of said first lyric portion relative to a start of said first Distinct Lyric Block;

displaying said first lyric portion;

accessing a corresponding portion of music notation data appropriate to said first lyric portion;

creating a first adjusted version comprising notes of said corresponding portion newly positioned horizontally to align horizontally with syllables of words of said first lyric portion;

displaying said first adjusted version.

2. The method of claim 1, further comprising the steps of:

accessing a second lyric portion from said first relative position within a second Distinct Lyric Block of said body of lyrics data;

displaying said second lyric portion;

creating a second adjusted version comprising notes of said corresponding portion newly positioned horizontally to align horizontally with syllables of words of said second lyric portion;

displaying said second adjusted version.

3. A lyric display method comprising the steps of:

loading a body of lyrics data from at least one file or stream comprising lyrics data of at least one music piece, where either or both of said file or stream and said body of lyrics data comprises symbols that each identify a Distinct Lyric Block of said body of lyrics data;

acquiring a sequence of performance comprising a list of symbols that each specify one of said symbols that each identify, where said symbols that each specify are in a predetermined order of planned performance;

advancing from one sequence step to a next sequence step within said sequence of performance;

ascertaining a specified symbol of said symbols that each identify as that symbol which is specified by the symbol at said next sequence step within said sequence of performance;

ascertaining an identified Distinct Lyric Block of said body of lyrics data as that Distinct Lyric Block which is identified by said specified symbol;

ascertaining a displayable portion of Distinct Lyric Block as either that which is a totality of said identified Distinct Lyric Block or else one of a plurality of consecutively displayed portions of said identified Distinct Lyric Block, where said consecutively displayed portions are determined according to predetermined criteria for amount of material to simultaneously display;

displaying said displayable portion of Distinct Lyric Block.

4. The method of claim 3, where said predetermined order of planned performance differs from the order in which said symbols that each identify appear either within said body of lyrics data or within said file or stream.

5. The method of claim 3, further comprising the steps of:

accessing a first lyric portion from a first relative position within a first Distinct Lyric Block of said body of lyrics data, where said first relative position is a position of said first lyric portion relative to a start of said first Distinct Lyric Block;

displaying said first lyric portion;

accessing a corresponding portion of music notation data appropriate to said first lyric portion;

creating a first adjusted version comprising notes of said corresponding portion newly positioned horizontally to align horizontally with syllables of words of said first lyric portion;

displaying said first adjusted version;

accessing a second lyric portion from said first relative position within a second Distinct Lyric Block of said body of lyrics data;

displaying said second lyric portion;

creating a second adjusted version comprising notes of said corresponding portion newly positioned horizontally to align horizontally with syllables of words of said second lyric portion;

displaying said second adjusted version.

6. The method of claim 5, where said predetermined order of planned performance differs from the order in which said symbols that each identify appear either within said body of lyrics data or within said file or stream.

7. The method of claim 1, where:

the number of said notes within said corresponding portion differs from the number of said syllables of words of said first lyric portion.

8. The method of claim 2, where:

the number of said notes within said corresponding portion differs from the number of said syllables of words of said first lyric portion or the number of said syllables of words of said second lyric portion.

9. The method of claim 5, where:

the number of said notes within said corresponding portion differs from the number of said syllables of words of said first lyric portion or the number of said syllables of words of said second lyric portion.

10. The method of claim 6, where:

the number of said notes within said corresponding portion differs from the number of said syllables of words of said first lyric portion or the number of said syllables of words of said second lyric portion.

* * * * *